(12) United States Patent
Yoshikawa et al.

(10) Patent No.: US 6,262,364 B1
(45) Date of Patent: Jul. 17, 2001

(54) ELECTROMAGNETIC-WAVE SHIELDING AND LIGHT TRANSMITTING PLATE

(75) Inventors: Masato Yoshikawa; Shinji Saito; Yasuhiro Morimura, all of Kodaira (JP)

(73) Assignee: Bridgestone Corporation, Tokyo (JP)

( * ) Notice: Subject to any disclaimer, the term of this patent is extended or adjusted under 35 U.S.C. 154(b) by 0 days.

(21) Appl. No.: 09/475,079

(22) Filed: Dec. 30, 1999

Related U.S. Application Data

(63) Continuation of application No. 09/099,343, filed on Jun. 18, 1998, now Pat. No. 6,090,473.

(30) Foreign Application Priority Data

| Jun. 24, 1997 | (JP) | 9-167382 |
| Jun. 24, 1997 | (JP) | 9-167383 |
| Jun. 24, 1997 | (JP) | 9-167384 |
| Jun. 25, 1997 | (JP) | 9-168685 |
| Jun. 25, 1997 | (JP) | 9-168686 |
| Jun. 25, 1997 | (JP) | 9-168687 |
| Jun. 25, 1997 | (JP) | 9-168688 |
| Sep. 24, 1997 | (JP) | 9-258374 |
| Sep. 24, 1997 | (JP) | 9-258375 |
| Sep. 24, 1997 | (JP) | 9-258376 |
| Sep. 24, 1997 | (JP) | 9-258377 |
| Sep. 24, 1997 | (JP) | 9-258378 |
| Sep. 24, 1997 | (JP) | 9-258378 |
| Sep. 24, 1997 | (JP) | 9-258379 |
| Sep. 24, 1997 | (JP) | 9-258380 |
| Sep. 24, 1997 | (JP) | 9-258381 |

(51) Int. Cl.$^7$ ................................ H05K 9/00
(52) U.S. Cl. ............... 174/35 MS; 174/35 GC; 361/816; 361/818; 428/203; 428/204
(58) Field of Search .................. 428/209, 210, 428/203, 204; 359/360; 442/16, 18; 174/35 R, 35 MS, 35 GC; 361/816, 818

(56) References Cited

U.S. PATENT DOCUMENTS

| 3,978,273 | * | 8/1976 | Groth | 428/434 |
| 4,826,718 | * | 5/1989 | Unsworth et al. | 428/175 |
| 4,863,789 | * | 9/1989 | Arai | 428/253 |
| 5,160,782 | * | 11/1992 | Hickman | 428/245 |
| 5,308,706 | * | 5/1994 | Kawaguchi et al. | 428/426 |
| 5,676,812 | * | 10/1997 | Kadokura | 205/50 |
| 6,074,741 | * | 6/2000 | Murata et al. | 428/327 |

\* cited by examiner

Primary Examiner—Anthony Dinkins
Assistant Examiner—W. David Walkenhorst
(74) Attorney, Agent, or Firm—Kanesaka & Takeuchi

(57) ABSTRACT

An electromagnetic-wave shielding and light transmitting plate suitable for an electromagnetic-wave shielding filter for a PDP, which has good electromagnetic-wave sheilding efficiency and light transparency, can provide distinct pictures, and can yet be easily made, is provided. The electromagnetic-wave shielding and light transmitting plate is formed of two transparent base plates and an adhesive layer made of EVA in which conductive particles are dispersed and mixed. The base plates are integrally bonded together by the adhesive layer. Adjusting the particle size and the dispersed amount of the conductive particles enables the manufacture of plates having desired electromagnetic-wave shielding efficiency, in addition, good light transparency, without moire phenomenon. Using an adhesive sheet formed by mixing the conductive particles into the EVA facilitates the manufacture of the aforementioned plate.

9 Claims, 9 Drawing Sheets

ELECTROMAGNETIC-WAVE SHIELDING AND LIGHT TRANSMITTING PLATE

CROSS REFERENCE TO RELATED APPLICATION

This is a continuation application of Ser. No. 09/099,343 filed on Jun. 18, 1998, which is now U.S. Pat. No. 6,090,473 which was issued to Yoshikawa et al. on Jul. 18, 2000.

FIELD OF THE INVENTION

The present invention relates to an electromagnetic-wave shielding and light transmitting plate and, more particularly, to an electromagnetic-wave shielding and light transmitting plate suitable for a front filter for a PDP (plasma display panel), which has good electromagnetic-wave shielding efficiency and light transparency.

BACKGROUND OF THE INVENTION

Recently, with the spread of electronic appliances including office automation apparatuses and communication instruments, electromagnetic wave emission from these appliances have come into a problem. That is, adverse effect of electromagnetic wave to the human body is feared and it is also a problem that the electromagnetic wave affects precision apparatus to operate in a wrong way.

In particular, a PDP, which is merchandised as a flat large display in current years, has large electromagnetic wave emission due to its operating mechanism.

Therefore, plates having good electromagnetic-wave shielding efficiency and light transparency have developed and come into practical use. Such plates are also used as windows of a place where a precision apparatus is installed, such as a hospital or a laboratory.

A conventional electromagnetic-wave shielding and light transmitting plate typically comprises transparent plates such as acrylic boards and a conductive mesh member like a wire netting and is formed by interposing the conductive mesh member between the transparent base plates and by integrating them.

The conductive mesh member conventionally used in the electromagnetic-wave shielding and light transmitting plate is a wire netting typically having a wire diameter between 30 and 500 $\mu$m and an open area ratio between about 30% and about 60%.

In the conventional electromagnetic-wave shielding and light transmitting plate using the conductive mesh member, however, the mesh member must be designed to have significantly small mesh size in order to provide sufficient electromagnetic-wave shielding efficiency. Since this means that a net is disposed in front of the PDP of an office automation apparatus, for example an image blurring phenomenon occurs so that distinct pictures can not be provided. Further, a phenomenon that the dots of the PDP and the grids of the mesh member produce interference fringes (so-called "moiré") also occurs and this phenomenon also makes the pictures unseemly.

The conventional electromagnetic-wave shielding and light transmitting plate has a disadvantages in that reflection of light on a display makes the pictures unseemly and in that the angle of visibility is small so that images on the display are not visible due to lateral incident light. Moreover, there is a problem that heat from the main body of an office automation apparatus results in overheating of the display.

OBJECT AND SUMMARY OF THE INVENTION

It is an object of the present invention to solve the above conventional problems and to provide an electromagnetic-wave shielding and light transmitting plate suitable for an electromagnetic-wave shielding filter for a PDP, which has good electromagnetic-wave shielding efficiency and light transparency, can provide distinct pictures, and can yet be easily made.

It is another object of the present invention to solve the above conventional problems and to provide an electromagnetic-wave shielding and light transmitting plate suitable for an electromagnetic-wave shielding filter for a PDP, which has good electromagnetic-wave shielding efficiency and has large angle of visibility.

It is yet another object of the present invention to solve the above conventional problems and to provide an electromagnetic-wave shielding and light transmitting plate suitable for an electromagnetic-wave shielding filter for a PDP, which has good electromagnetic-wave shielding efficiency and light transparency, can provide distinct pictures, and has adiathermancy.

An electromagnetic-wave shielding and light transmitting plate of a first aspect comprises two transparent base plates and an adhesive layer made of resin in which conductive particles are dispersed and mixed, wherein the base plates are integrally bonded by the adhesive layer.

In the electromagnetic-wave shielding and light transmitting plate of the first aspect, since the conductive particles are dispersed in the adhesive layer, adjusting the particle size and the dispersed amount of the conductive particles can be made to enable, the manufacture of plates having desired electromagnetic-wave shielding efficiency, in addition, good light transparency, without moiréphenomenon.

The electromagnetic-wave shielding and light transmitting plate of the first aspect can be easily made by interposing the adhesive sheet, which is formed by mixing the conductive particles into ethylene-vinyl acetate copolymer (EVA), between the two transparent base plates and bonding them.

In the first aspect, the particle size of the conductive particles is preferably less than 0.5 mm and the ratio of the conductive particles relative to the resin is preferably in a range from 0.1 to 50% by weight.

In addition, the resin is preferably ethylene-vinyl acetate copolymer.

In the electromagnetic-wave shielding and light transmitting plate of the first aspect, a conductive mesh member may be also used.

The electromagnetic-wave shielding and light transmitting plate of the first aspect has the following effects so that it is industrially useful, for example, as an electromagnetic-wave shielding filter for a PDP.

1. Adjusting the particle size and the dispersed amount of the conductive particles provides desired electromagnetic-wave shielding efficiency and good light transparency.
2. The moiré phenomenon due to the use of a conductive mesh member can be prevented so as to provide distinct pictures.
3. The plate can be easily made only by using a normal bonding process.

An electromagnetic-wave shielding and light transmitting plate of a second aspect includes a transparent base plate having a conductive layer which is bonded to a surface of the transparent base plate by resin wherein the conductive layer is a conductive foil which is pattern etched.

The use of pattern etching allows the metallic foil to be etched in any pattern configuration so that the line width, space, and opening configuration can be selected freely as compared with a conductive mesh member. Therefore, the aforementioned electromagnetic-wave shielding and light transmitting plate is made possible by using such a metallic foil which has both good electromagnetic-wave shielding efficiency and good light transparency and which never cause moiré phenomenon.

In the second aspect, the conductive layer may be interposed between two transparent base plates. Further, the conductive layer may be disposed on one of surfaces of one transparent base plate.

It is preferable that the metallic foil is formed in a predetermined pattern by steps of coating with photoresist, pattern exposure, and etching.

In the second aspect, the resin for bonding the conductive layer is preferably ethylene-vinyl acetate copolymer (EVA).

The electromagnetic-wave shielding and light transmitting plate of the second aspect has the following effects so that it is industrially useful, for example, as an electromagnetic-wave shielding filter for a PDP.

1. Selecting the configuration of the pattern etching of conductive foil provides desired electromagnetic-wave shielding efficiency and good light transparency.
2. The moiré phenomenon due to the use of a conductive mesh member can be prevented so as to provide distinct pictures.

An electromagnetic-wave shielding and light transmitting plate of a third aspect includes a transparent base plate having a conductive layer which is formed on a surface of the transparent base plate wherein in that the conductive layer is a conductive film which is pattern etched.

The use of pattern etching allows the conductive film to be etched in any pattern configuration so that the line width, space, and opening configuration can be selected freely as compared with a conductive mesh member. Therefore, the electromagnetic-wave shielding and light transmitting plate which has both good electromagnetic-wave shielding efficiency and good light transparency and which never cause moiré phenomenon is made possible.

The plate of the third aspect may comprise two transparent base plates integrally bonded by adhesive resin together, wherein the conductive layer is formed on at least one of the transparent base plates.

The electromagnetic-wave shielding and light transmitting plate can be easily made by interposing the adhesive film which is made of adhesive resin such as ethylene-vinyl acetate copolymer (EVA) between the transparent base plates onto which the pattern-etched conductive film is previously formed, and bonding them, The conductive film is preferably a metallic film which is formed in a predetermined pattern by steps of coating with photoresist, pattern exposure, and etching.

In the third aspect, the adhesive resin for bonding the transparent base plates is preferably ethylene-vinyl acetate copolymer (EVA).

The electromagnetic-wave shielding and light transmitting plate of the third aspect has the following excellent effects so that it is industrially useful, for example, as an electromagnetic-wave shielding filter for a PDP.

1. Selecting the configuration of the pattern etching of conductive film provides desired electromagnetic-wave shielding efficiency and good light transparency.
2. The moiré phenomenon due to the use of a conductive mesh member can be prevented so as to provide distinct pictures
3. Previously forming the conductive film by pattern etching on the transparent base plate facilitates the manufacture of the aforementioned plate only by using a normal bonding process.

An electromagnetic-wave shielding and light transmitting plate of a fourth aspect includes a transparent base plate having a conductive layer which is formed on a surface of the transparent base plate wherein the conductive layer is conductive ink provided on the surface of the transparent base plate by pattern printing.

The use of pattern printing allows the conductive layer to be printed in any pattern configuration so that the line width, space, and opening configuration can be selected freely as compared with a conductive mesh member.

Therefore, the electromagnetic-wave shielding and light transmitting plate which has both good electromagnetic-wave shielding efficiency and good light transparency and which never cause moiré phenomenon is made possible.

It is preferable that the plate of the fourth aspect comprises two transparent base plates integrally bonded by adhesive resin together, wherein the conductive layer is formed on at least one of the surfaces of the transparent base plates.

The electromagnetic-wave shielding and light transmitting plate can be easily made by interposing the adhesive film which is made of resin such as ethylene-vinyl acetate copolymer (EVA) between the transparent base plates onto which the conductive layer is previously formed onto the transparent base plate by the pattern printing, and bonding them.

In the fourth aspect, the resin for bonding the transparent base plates is preferably ethylene-vinyl acetate copolymer (EVA).

The electromagnetic-wave shielding and light transmitting plate of the fourth aspect has the following excellent effects so that it is industrially useful, for example, as an electromagnetic-wave shielding filter for a PDP.

1. Selecting the configuration of the pattern printing of conductive layer provides desired electromagnetic-wave shielding efficiency and good light transparency.
2. The moiré phenomenon due to the use of a conductive mesh member can be prevented so as to provide distinct pictures.
3. Previously forming the conductive layer by pattern printing on the transparent base plate facilitates the manufacture of the aforementioned plate only by using a normal bonding process.

An electromagnetic-wave shielding and light transmitting plate of a fifth aspect comprises two transparent base plates and a conductive mesh member, interposed therebetween, which are integrally bonded by adhesive resin together and wherein the transparent base plate located at the opposite side of an electromagnetic wave source is formed with an antireflection film, which is a laminated film of a high-refractive transparent film and a low-refractive transparent film, on a surface thereof.

In the fifth aspect, since the transparent base plate located at the opposite side of an electromagnetic wave source is formed with the antireflection film, which is a laminated film of a high-refractive transparent film and a low-refractive transparent film, on a surface thereof, the light reflection is prevented by the light interference action of the antireflection film so that the electromagnetic-wave shielding and light transmitting plate of this aspect has large angle of visibility.

Using a transparent conductive film as the high-refractive transparent film provides excellent electromagnetic-wave shielding efficiency with the cooperation of the conductive mesh member.

It is preferable that the antireflection film is a multi-layered film formed by laminating alternatively high-refractive transparent films and low-refractive transparent films.

It is also preferable that the antireflection film is formed with an antifouling film thereon.

Since the conductive mesh member is interposed between the transparent base plates, the electromagnetic-wave shielding and light transmitting plate of the fifth aspect has an anti-scattering effect when broken and thus has high safety.

In the fifth aspect, the adhesive resin is preferably transparent ethylene-vinyl acetate copolymer (EVA).

The electromagnetic-wave shielding and light transmitting plate of the fifth aspect has good electromagnetic-wave shielding efficiency and light transparency, and can ensure that images on the display are sufficiently visible even with lateral incident light. Further, since the transparent base plates are strongly bonded by adhesive resin, the transparent base plates do not scatter when receiving an impact so that the plate of the fifth aspect provides excellent safety and therefore is industrially useful, for example, as an electromagnetic-wave shielding filter for a PDP.

An electromagnetic-wave shielding and light transmitting plate of a sixth aspect comprises two transparent base plates and a conductive mesh member interposed therebetween, which are integrally bonded by adhesive resin together wherein the transparent base plate located at the side of an electromagnetic wave source is formed with a heat ray reflecting transparent conductive film on a surface thereof.

Since the transparent conductive film is formed on the surface of the transparent base plate located at the side of the electromagnetic wave source, the electromagnetic-wave shielding and light transmitting plate of the sixth aspect can provide excellent electromagnetic-wave shielding effect in cooperation with the conductive mesh member. Since the electromagnetic-wave shielding effect is obtained by the combination of the transparent conductive film and the conductive mesh member, the the conductive mesh member can be considered putting emphasis on the moiré the conductive mesh can be designed in such a configuration to cause little moiré phenomenon.

Since the transparent conductive film has heat ray reflection efficiency, it can reflect heat ray from an office automation apparatus to effect the thermal insulation.

Since the conductive mesh member is interposed between the transparent base plates, the electromagnetic-wave shielding and light transmitting plate of the sixth aspect has an anti-scattering effect when broken and thus has high safety.

In the sixth aspect, the adhesive resin is preferably transparent ethylene-vinyl acetate copolymer (EVA).

The electromagnetic-wave shielding and light transmitting plate of the sixth aspect has good electromagnetic-wave shielding efficiency and light transparency, and has a function of reducing heat radiation from a display. Further, since the transparent base plates are strongly bonded by adhesive, the transparent base plates do not scatter when receiving an impact so that the plate of the sixth aspect provides excellent safety and therefore is industrially useful, for example, as an electromagnetic-wave shielding filter for a PDP.

An electromagnetic-wave shielding and light transmitting plate of a seventh aspect comprises two transparent base plates and a conductive mesh member interposed therebetween, which are integrally bonded by adhesive resin together wherein at least one of the transparent base plates is formed with a transparent conductive film on one or both of surfaces thereof.

Since the transparent conductive film is formed, the electromagnetic-wave shielding and light transmitting plate of the seventh aspect can provide excellent electromagnetic-wave shielding effect in cooperation with the conductive mesh member. Since the electromagnetic-wave shielding effect is obtained by the combination of the transparent conductive film and the conductive mesh member, of the conductive mesh member can be considered putting emphasis on the moiré the conductive mesh can be designed in such a configuration to cause little moiréphenomenon.

Since the conductive mesh member is interposed between the transparent base plates, the electromagnetic-wave shielding and light transmitting plate of the seventh aspect has an anti-scattering effect when broken and thus has high safety.

In the seventh aspect, the adhesive resin is preferably ethylene-vinyl acetate copolymer (EVA).

The electromagnetic-wave shielding and light transmitting plate of the seventh aspect has good electromagnetic-wave shielding efficiency and light transparency, and has a function of reducing the moiré phenomenon produced in cooperation with the matrix of the display. Further, since the transparent base plates are strongly bonded by transparent adhesive, the transparent base plates do not scatter when receiving an impact so that the plate of the seventh aspect provides excellent safety and therefore is industrially useful, for example, as an electromagnetic-wave shielding filter for a PDP.

An electromagnetic-wave shielding and light transmitting plate of an eighth aspect comprises two transparent base plates and one of the following conductive mesh members A through C interposed therebetweer, which are integrally bonded by adhesive resin together:

A. a conductive mesh member made of metallic fibers of which the wire diameter is between 1 and 200 $\mu$m and the open area ratio is between 30 and 99.9%;

B. a conductive mesh member made of metal-coated organic fibers of which the wire diameter is between 1 and 200 $\mu$m and the open area ratio is between 30 and 99.9%; and C. a conductive mesh member in which metallic fibers and/or metal-coated organic fibers and organic fibers are woven. It is preferable that the conductive mesh member has a wire diameter between 1 and 200 $\mu$m and an open area ratio between 30 and 99.9%

It should be noted that the open area ratio of the conductive mesh member means the ratio of areas, where the openings occupy, relative to the projected area of the conductive mesh member.

The conductive mesh member having the wire diameter and the open area ratio shown in the above A, B can provide good electromagnetic-wave shielding efficiency and light transparency, and can prevent the moiré phenomenon.

The conductive composite mesh member of the above C, in which organic fibers are also used, can be woven without fraying even when it is made of fine fibers to have a large open area ratio, thereby relatively freely designins the wire diameter and the open area ratio and therefore enables the easy manufacture of the electromagnetic-wave shielding and light transmitting plate having good electromagnetic-wave shielding efficiency and light transparency, without moiré-phenomenon.

Since the conductive mesh member is interposed between the transparent base plates, the electromagnetic-wave shielding and light transmitting plate of the eighth aspect has an anti-scattering effect when broken and thus has high safety.

In the eighth aspect, the adhesive resin is preferably transparent ethylene-vinyl acetate copolymer (EVA).

The electromagnetic-wave shielding and light transmitting plate of the eighth aspect has good electromagnetic-wave shielding efficiency and light transparency, and has a function of reducing the moiré phenomenon produced by the interference of light with the matrix of the display. Further, since the transparent base plates are strongly bonded by transparent adhesive, the transparent base plates do not scatter when receiving an impact so that the plate of the seventh aspect provides excellent safety and therefore is industrially useful, for example, as an electromagnetic-wave shielding filter for a PDP.

BRIEF DESCRIPTION OF DRAWINGS

FIG. 6 is a schematic sectional view showing an embodiment of an electromagnetic-wave shielding and light transmitting plate according to the present invention and FIG. 6b is an enlarged view of a part 60B of FIG. 6a;

DESCRIPTION OF THE PREFERRED EMBODIMENTS

Hereinafter, embodiments of an electromagnetic-wave shielding and light transmitting plate of the first aspect will be described with reference to drawings.

Figure 1:
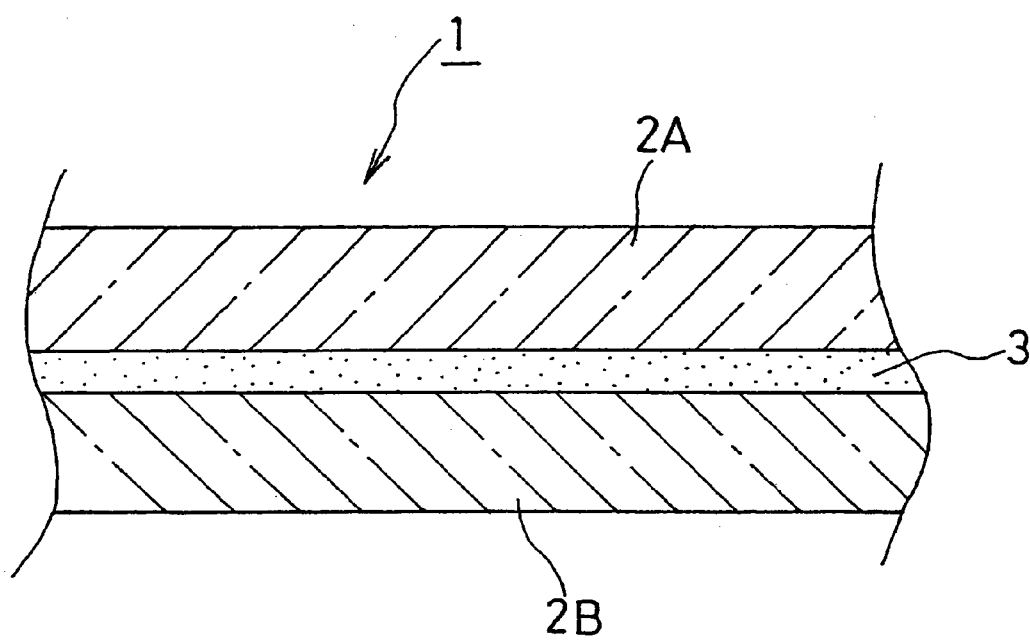
FIG. 1 is a schematic sectional view showing an embodiment of an electromagnetic-wave shielding and light transmitting plate according to the present invention.

FIG. 1 is a schematic sectional view showing the embodiment of the electromagnetic-wave shielding and light transmitting plate of the first aspect.

As shown in FIG. 1, the electromagnetic-wave shielding and light transmitting plate 1 of the first aspect comprises two transparent base plates 2A, 2B and an adhesive layer 3 made of adhesive resin such as EVA in which conductive particles are dispersed and mixed and is formed by interposing the adhesive layer between the transparent base plates and by integrally bonding them.

Examples of materials of the transparent base plates 2A, 2B include glass, polyester, polyethylene terephthalate (PET), polybutylene terephthalate, polymethyl methacrylate (PMMA), acrylic board, polycarbonate (PC), polystyrene, triacetate sheet, polyvinyl alcohol, polyvinyl chloride, polyvinylidene chloride, polyethylene, ethylene-vinyl acetate copolymer, polyvinylbutyral, metal ionic cross-linked ethylene-methacrylic copolymer, polyurethane, and cellophane. Preferably selected from the above materials are glass, PET, PC, and PMMA.

The thicknesses of the transparent base plates 2A, 2B are suitably determined in accordance with requirements (e.g. strength, light weight) due to the application of a plate to be obtained and are normally in a range from 0.1 to 5 mm.

The transparent base plates 2A, 2B are not necessarily made of the same material. For example, in a case of a PDP front filter in which only the front surface is required to have scratch resistance and durability, the transparent base plate 2A as the front surface may consist of a glass plate having a thickness of 1.0 to 4.0 mm and the transparent base plate 2B as the rear surface may consist of a PET board having a thickness of 0.05 to 0.3 mm.

The transparent base plate 2A as the front surface may be processed by hard coating with silicone oxide, soil resistant finish with polyvinylidene fluoride paint, AR (anti-reflection) coating with laminated layers of silicone dioxide layer and titanium dioxide layer, and/or anti-glare finish by hard coating including light-scattering agent or bard coating forming convexoconcaves to improve its function. On the other hand, the transparent base plate 2B as the rear surface may be processed by heat ray reflection coating with zinc oxide and silver film to improve its function.

Examples of resin of adhesive layer 3 for bonding such transparent base plates 2A, 2B include copolymers of ethylene group, such as ethylene-vinyl acetate copolymer, ethylene-methyl acrylic copolymer, ethylene- (meth) acrylic copolymer, ethylene-ethyl (meth) acrylic copolymer, ethylene-methyl (meth) acrylic copolymer, metal ionic cross-linked ethylene- (meth) acrylic copolymer, partial saponified ethylene-vinyl acetate copolymer, calboxylated ethylene-vinyl acetate copolymer, ethylene- (meth) acrylic-maleic anhydride copolymer, and ethylene-vinyl acetate-(meth) acrylate copolymer. It should be noted that "(meth) acrylic" means "acrylic or methacrylic". Besides the above resins, polyvinylbutyral (PVB) resin, epoxy resin, acrylic resin, phenol resin, silicone resin, polyester resin, and urethane resin may be employed. The best one among the aforementioned resins is ethylene-vinyl acetate copolymer (EVA) because it can offer the best balance of performance and can be easily handled. In view of the impact resistance, the perforation resistance, the adhesive property, and the transparency points of view, PVB resin used in a laminated glass for a vehicle is also preferable.

It is preferable that the PVB resin contains polyvinyl acetal between 70 and 95% by unit weight and polyvinyl acetate between 1 and 15% by unit weight, and has an average degree of polymerization between 200 and 3000, preferably 300 and 2500. The PVB resin is used as resin composition containing plasticizer.

Examples of plasticizer in the PVB resin composition include organic plasticizers, such as monobasic acid ester and polybasic acid ester, and phosphoric acid plasticizers.

Preferable examples of such monobasic acid ester are ester as a result of reaction of organic acid, such as butyric acid, isobutyric acid, caproic acid, 2-ethylbutyric acid, heptoic acid, n-octyl acid, 2-thylhexyl acid, pelargonic acid (n-nonyl acid), or decyl acid, and triethylene glycol and, more preferably, are triethylene-di-2-ethylbthyrate, triethylene glycol-di-2-ethylhexoate, triethylene glycol-di-caproate, and triethylene glycol-di-n-ocotoate. Ester of one of the above organic acids and tetraethylene glycol or tripropylene glycol may be also employed.

Preferable examples of plasticizers of polybasic acid ester group are ester of organic acid, such as adipic acid, sebacic acid, or azelaic acid, and straight chain like or brunch like alcohol with from 4 to 8 carbon atoms and, more preferably, are dibutyl sebacate, dioctyl acetate, and dibutyl carbitol adipate.

Examples of phosphoric acid plasticizers include tributoxyethyl phosphate, isodecyl phenyl phosphate, and triisopropyl phosphate.

Insufficient plasticizer in the PVB resin composition reduces the film-forming property, while excessive plasticizer spoils the durability during high temperature. Therefore, the amount of plasticizer in the PVB resin composition is between 5 and 50 parts by weight, preferably between 10 and 40 parts by weight, per 100 parts by weight of polyvinyl butyral resin.

The PVB resin composition may further include additive (s) such as stabilizer, antioxidant, and ultraviolet absorbing agent in order to prevent the deterioration. The conductive particles to be dispersed in the adhesive layer 3 may be any particles having conductivity and the following are examples of such conductive particles.

(i) carbon particles or powder;
(ii) particles or powder of metal such as nickel, indium, chromium, gold, vanadium, tin, cadmium, silver, platinum, aluminum, copper, titanium, cobalt, or lead, alloy thereof, or conductive oxide thereof; and
(iii) particles made of plastic such as polystyrene and polyethylene, which are surfaced with coating layer of a conductive material from the above (i) and (ii)

Because the conductive particles of large particle diameter affect the light transparency and the thickness of the adhesive layer 3, it is preferable that the particle diameter is 0.5 mm or less. The preferable particle diameter of the conductive particles is between 0.01 and 0.5 mm.

The high mixing ratio of the conductive particles in the adhesive layer 3 spoils the light transparency, while the low mixing ratio makes the electromagnetic-wave shielding efficiency short. The mixing ratio of the conductive particles is preferably between 0.1 and 50% by weight, particularly between 0.1 and 20% by weight and more particularly between 0.5 and 20% by weight, relative to the resin such as EVA.

The color and the luster of the conductive particles can be suitably selected according to the application. In a case of a display filter, conductive particles having a dark color such as black or brown and dull surfaces are preferable. In this case, the conductive particles can suitably adjust the light transmittance of the filter so as to make the display easy-to-see.

The electromagnetic-wave shielding and light transmitting plate of the first aspect can be easily made by interposing the adhesive layer, in which the conductive particles of predetermined amount and crosslinking agent for heat curing or photo-curing are mixed to the resin such as EVA, between the transparent base plates 2A and 2B, decompressing and deaerating them under the heated condition, and hardening the adhesive layer by heating or irradiation to integrate them.

The thickness of the adhesive layer 3 can vary according to the application of the electromagnetic-wave shielding and light transmitting plate and is normally between 0.05 and 1.0 mm. When the thickness of the adhesive layer 3 is less than 0.05 mm, the thickness of the conductive layer for shielding electromagnetic-wave becomes too thin so as not to provide sufficient electromagnetic-wave shielding efficiency. On the other hand, the thickness exceeding 1.0 mm may spoil the light transparency. Therefore, the adhesive sheet is formed to have a thickness from 0.05 to 1.0 mm to make an adhesive layer having such a thickness.

Hereinafter, the adhesive layer in which EVA is used as the resin will be described in detail.

EVA in which the content of vinyl acetate is between 5 and 50% by weight, preferably between 15 and 40% by weight, is employed. Less than 5% by weight of vinyl acetate interferes with the weatherability and the transparency, while exceeding 40% by weight of vinyl acetate significantly reduces mechanical characteristics, makes the film forming difficult, and produces a possibility of blocking between sheets.

Suitably employed as the crosslinking agent when the EVA is crosslinked by heating is organic peroxide which is selected according to the temperature for sheet process, the temperature for crosslinking agent, and the storage stability. Examples of available peroxide includes 2,5-dimethylhexane-2,5-dihydro peroxide; 2,5-dimethyl-2,5-di (tert-butyl-peroxy)-hexane-3; di-tert-butyl peroxide; tert-butylcumyl peroxide; 2,5-dimethyl-2,5-di (tert-butyl-peroxy)-hexane; dicumyl peroxide; $\alpha,\alpha'$-bis (tert-butyl peroxy)-benzene; n-buthyl-4,4-bis (tert-butyl-peroxy)-valerate; 2,2-bis (tert-butyl-peroxy)-butane, 1,1 -bis (tert-butyl-peroxy)-cyclohexane; 1,1-bis (tert-butyl-peroxy)-3,3, 5-trimethylcyclohexane; tert-butyl peroxy benzoate; benzoyl peroxide; tert-butyl peroxy acetate; 2,5-dimethyl-2,5-bis (tert-butyl-peroxy)-hexyne-3; 1,1-bis (tert-butyl-peroxy)-3,3,5-trimethylcyclohexane; 1,1-bis (tert-butyl-peroxy)-cyclohexane; methyl ethyl ketone peroxide; 2,5-dimethylhexyl-2,5-bis-peroxy-benzoate; tert-butyl-hydroperoxide; p-menthane hydroperoxide; p-chlorbenzoyl peroxide; tert-butyl peroxyisobutyrate; hydroxyheptyl peroxide; and chlorohexanon peroxide. These are used alone or in mixed state, normally less than 5 parts by weight, preferably from 0.5 to 5.0 parts by weight per 100 parts by weight of EVA.

The organic peroxide is normally mixed to the EVA by an extruder or a roll mill or may be added to the EVA sheet by means of impregnation by dissolving the peroxide into organic solvent, plasticizer, or vinyl monomer.

In order to improve the properties (such as mechanical strength, optical property, adhesive property, weatherability, blushing resistance, and crosslinking speed) of the EVA, a compound containing one selected from acryloxy group or methacryloxy group and one selected from allyl group may be added into the EVA. Such a compound used for this purpose is usually acrylic acid or methacrylic acid derivative, for example, ester or amide thereof Examples of ester residues include alkyl group such as methyl, ethyl, dodecyl, stearyl, and lauryl and, besides such alkyl group, cycloxyhexyl group, tetrahydrofurfiiyl group, aminoethyl group, 2-hydroethyl, 3-hydroxypropyl group, and 3-chloro-2-hydroxypropyl group. Ester with polyfunctional alcohol such as ethylene glycol, triethylene glycol, polyethylene glycol, trimethylolpropane, or pentaerythritol may be also employed. The typical one of such amide is diacetone acrylamide.

More concretely, examples include compounds containing polyfunctional ester such as acrylic ester or methacrylate such as trimethylolpropane, pentaerythritol and glycerin, or allyl group such as triallyl cyanurate, triallyl isocyanurate, diallyl phthalate, diallyl isophthalate, and diallyl maleate. These are used alone or in the mixed state, normally from 0.1 to 2 parts by weight, preferably from 0.5 to 5 parts by weight per 100 parts by weight of EVA.

When EVA is crosslinked by light, photosensitizer is used instead of the above peroxide, normally less than 5 parts by weight, preferably from 0.1 to 5.0 parts by weight per 100 parts by weight of EVA.

In this case, examples of available photosensitizer include benzoin; benzophenone; benzoin methyl ether; benzoin ethyl ether, benzoin isopropyl ether; benzoin isobutyl ether; dibenzyl; 5-nitroaniline; hexachlorocyclopentadiene; p-nitrodiphenyl; p-nitroaniline; 2,4,6-trinitroaniline; 1,2-benzanthraquinone; and 3-methyl-1,3-diazo-1,9-benzanthrone. These can be used either alone or in the mixed state.

In this case, silane coupling agent is further used as adhesive accelerator. Examples of the silane coupling agent include vinyltriethoxysilane, vinyl-tris (β-methoxyethoxy) silane, γ-methacryloxypropyl trimethoxy silane, vinyltriacetoxy silane, γ-glycidoxypropyltrimetoxysilane, γ-glycidoxypropyltrietoxysilane, 62 - (3,4-epoxycyclohexyl) ethyl trimethoxy silane, γ-chloropropyl methoxy silane, vinyltrichlorosilane, γ-mercaptopropyl trimethoxy silane, γ-aminopropyl triethoxy silane, and N-(β-aminoethyl)-γ-aminopropyl trimethoxy silane.

These are used alone or in the mixed state, normally from 0.001 to 10 parts by weight, preferably from 0.001 to 5 parts by weight per 100 parts by weight of EVA.

The EVA adhesive layer may further include, in small amounts, ultraviolet absorbing agent, infrared absorbing agent, antioxidant, paint processing aid, and/or coloring agent. If necessary, the EVA adhesive layer may still further include, in small amounts, filler such as hydrophobic silica and calcium carbonate.

It is also effective that an adhesive sheet made of EVA is surfaced by corona discharge process, low temperature plasma process, electron beam irradiation process, or ultraviolet irradiation process as measures of improving the adhesive property.

EVA adhesive sheet is made by first mixing the EVA, the conductive particles, and the additives listed above, kneading them by an extruder or a roll, and after that, forming in a predetermined configuration by means of a film forming method such as calendering, rolling, T-die extrusion, or inflation. During the film formation, embossing is provided for preventing the blocking between sheets and facilitating the deaerating while being compressed onto the transparent base plates.

In the electromagnetic-wave shielding and light transmitting plate of the first aspect, the adhesive layer includes the conductive particles so as to have itself the electromagnetic-wave shielding efficiency, thereby allowing the elimination of the conductive mesh member used in the conventional one. However, this does not mean that the conductive mesh member must not be used in combination with the conductive particles.

Forming the conductive mesh member to have such a mesh size as to avoid the visibility loss due to the moiré phenomenon and compensating shortage of the electromagnetic-wave shielding efficiency by the conductive particles can provide excellent electromagnetic-wave shielding efficiency.

The conductive mesh member is preferably made of metal wire such as stainless steel wire or polyester or nylon wire which is applied with conductive material by plating, coating, or impregnation, the wire diameter being in a range from 10 to 500 $\mu$m, and preferably has an open area ratio (the ratio of opening areas relative to the projected area of the mesh member) in a rang from 20 to 98%.

The electromagnetic-wave shielding and light transmitting plate including the conductive mesh member can be formed by sandwiching the conductive mesh member between two EVA adhesive sheets, at least one of which contains the conductive particles, then interposing them between two transparent base plates, and integrally bonding them. Thus, the conductive mesh member does not make the manufacturing complex.

The electromagnetic-wave shielding and light transmitting plate of the present invention can be effectively used as a front filter for a PDP or as windows of a place where a precision apparatus is installed, such as a hospital or an institute.

Figure 2A:
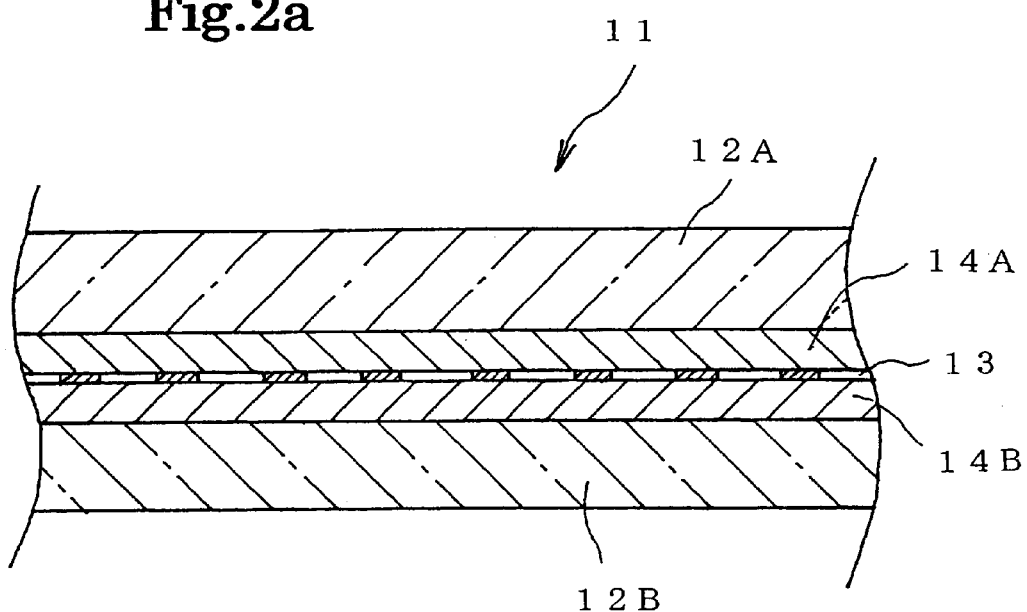
FIGS. 2a and 2b are schematic sectional views showing embodiments of an electromagnetic-wave shielding and light transmitting plate according to the present invention.
Figure 2B:
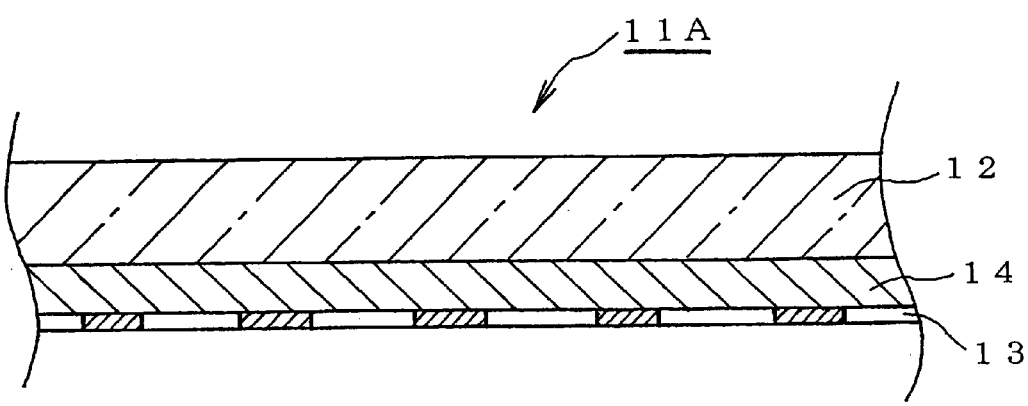

FIGS. 2a, 2b are schematic sectional views showing embodiments of an electromagnetic-wave shielding and light transmitting plate of the second aspect. FIGS. 3a through 3f are plan views showing examples of etching patterns.

An electromagnetic-wave shielding and light transmitting plate 11 shown in FIG. 2a comprises two transparent base plates 12A, 12B, a metallic foil 13 as a conductive foil, and adhesive layers 14A, 14B and is formed by sandwiching the metallic foil 13 between the adhesive layers 14A and 14B, interposing them between the transparent base plates 12A and 12B, and by integrally bonding them.

An electromagnetic-wave shielding and light transmitting plate 11A shown in FIG. 2b comprises a transparent base plate 12, a metallic foil 13, and an adhesive layer 14 and is formed by bonding the metallic foil 13 to the adhesive layer 14 on one surface of the transparent base, plate 12.

The material of the transparent base plates 12A, 12B may be the same as used in the transparent base plates of the first aspect.

The thicknesses of the transparent base plates 2A, 2B are suitably determined in accordance with requirements (e.g. strength, light weight) due to the application of a plate to be obtained and are normally in a range from 0.05 to 5 mm.

The transparent base plates 12A, 12B are not necessarily made of the same material. For example, in a case of a PDP front filter in which only the front surface is required to have scratch resistance and durability, the transparent base plate 12A as the front surface may consist of a glass plate having a thickness of 1.0 to 4.0 mm and the transparent base plate 12B as the rear surface may consist of a PET board having a thickness of 0.05 to 0.3 mm.

The transparent base plate 12A as the front surface may be processed by hard coating with silicone oxide, soil resistant finish -with polyvinylidene fluoride paint, AR (anti-reflection) coating with laminated layers of silicone dioxide layer and titanium dioxide layer, and/or anti-glare finish by hard coating including light-scattering agent or hard coating forming convexoconcaves to improve its function. On the other hand, the transparent base plate 12B as the rear surface may be processed by heat ray reflection coating with zinc oxide and silver film to improve its function.

In the structure shown in FIG. 2b, the transparent base plate 12 may be the same as the transparent base plate 12A as the front surface.

Examples of metal of the metallic foil include copper, stainless steel, aluminum, nickel, iron, brass, or alloy thereof Preferably selected from the above are copper, stainless steel, and aluminum.

It is not preferable that the metallic foil is too tin in view of the handling and the working of pattern etching and it is also not preferable that the metallic foil is too thick because it affects the thickness of the electromagnetic-wave shielding and light transmitting plate to be obtained and makes a time period for etching process longer. Therefore, the thickness of the metallic foil is preferably in a range from 1 to 200 $\mu$m.

A method of pattern etching such metal may be any one of commonly used methods and is preferably a photoetching using a resist. In this case, a resist pattern is formed by first coating the metallic foil with the photo-resist, exposing a pattern using a desired mask, and then developing the pattern. After that, metallic foil excepting places where the resist exists is removed by etchant such as ferric chloride.

The use of pattern etching can allow free designing of pattern so that the metallic foil can be etched in any line width, space, and opening configuration, thereby preventing the moiré phenomenon, and allowing easy formation of an electromagnetic-wave shielding and light transmitting plate having desired electromagnetic-wave shielding efficiency and light transparency.

Figure 3A:
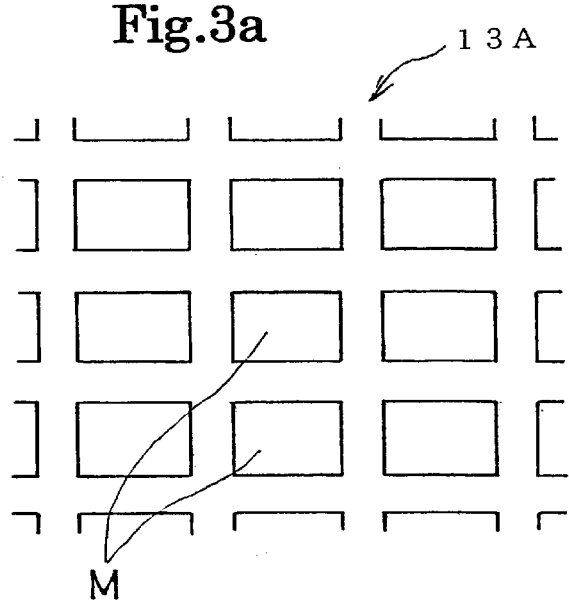
FIGS. 3a through 3f are plan views showing examples of etching patterns.
Figure 3B:
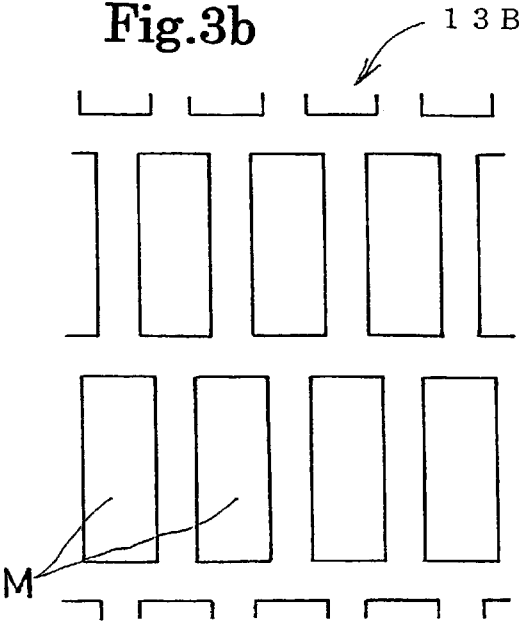
Figure 3C:
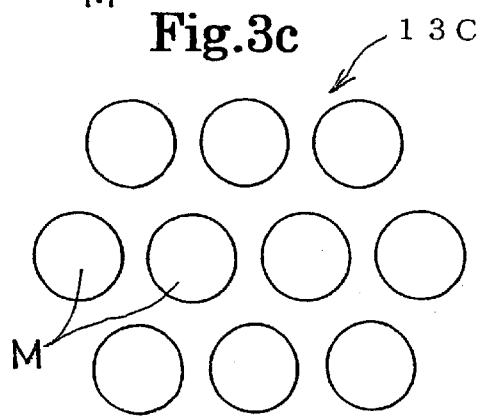

In the second aspect, the configuration of etching pattern of the metallic foil is not particularly limited. Examples include metallic foils 13A, 13B each being formed in a lattice arrangement having rectangular openings M as shown in FIGS. 3a, 3b and metallic foils 13C, 13D, 13E, 13F each being formed in a punching metal-like arrangement having circular, hexagon, triangle, or elliptical openings M as shown in FIGS. 3c, 3d, 3e and 3f. Besides the arrangements in which the openings M are regularly arranged, an arrangement in which openings M are randomly arranged may be used to prevent the moiré phenomenon.

In order to ensure the electromagnetic-wave shielding efficiency and the light transparency, the ratio of opening areas of the metallic foil relative to the projected area of the metallic foil (hereinafter, referred to as "open area ratio") is preferably in a range from 20 to 90%.

When the metallic foil is designed to have a greater open area ratio in order to improve the light transparency, a transparent conductive layer may be formed onto the transparent base plate 12A or 12B, or the transparent base plate 12 to compensate a shortage of electromagnetic-wave shielding efficiency.

The resin of adhesive layers 14A, 14B, 14 for bonding such metallic foil 13 onto the transparent base plates 12A, 12B, 12 may be the same as the resin of the adhesive layer 3 of the first aspect.

The electromagnetic-wave shielding and light transmitting plate 11 of FIG. 2a can be easily made by sandwiching the pattern-etched metallic foil 13 between two adhesive films, in which crosslinking agent for heat curing or photo-curing is mixed to a copolymer of ethylene series such as EVA, interposing them between the transparent base plates 12A and 12B, then decompressing and deaerating them under the heated condition, and hardening the adhesive layer by heating or irradiation to integrate them.

The electromagnetic-wave shielding and light transmitting plate 11A of FIG. 2b can be easily made by piling up the transparent base plate 12, such adhesive film 14 as mentioned above, and the pattern-etched metallic foil 13, and hardening them to integrate them in the same manner as mentioned above.

The thickness of each adhesive layer 14A, 14B, 14 can vary according to the application of the electromagnetic-wave shielding and light transmitting plate and is normally between 0.05 and 1.0 mm. Therefore, the adhesive film is formed to have a thickness from 0.05 to 1.0 mm to make an adhesive layer having such a thickness.

In the second aspect, the adhesive layer in which EVA is used as the copolymer of ethylene series is preferably the same as the adhesive layer of the first aspect but not including the conductive particles.

EVA adhesive film is made by first mixing the EVA and the additives, kneading them by an extruder or a roll, and after that, forming in a predetermined sheet configuration by means of a film forming method such as calendering, rolling, T-die extrusion, or inflation. During the film formation, embossing is provided for preventing the blocking and facilitating the deaerating while being compressed onto the transparent base plates.

Figure 4:
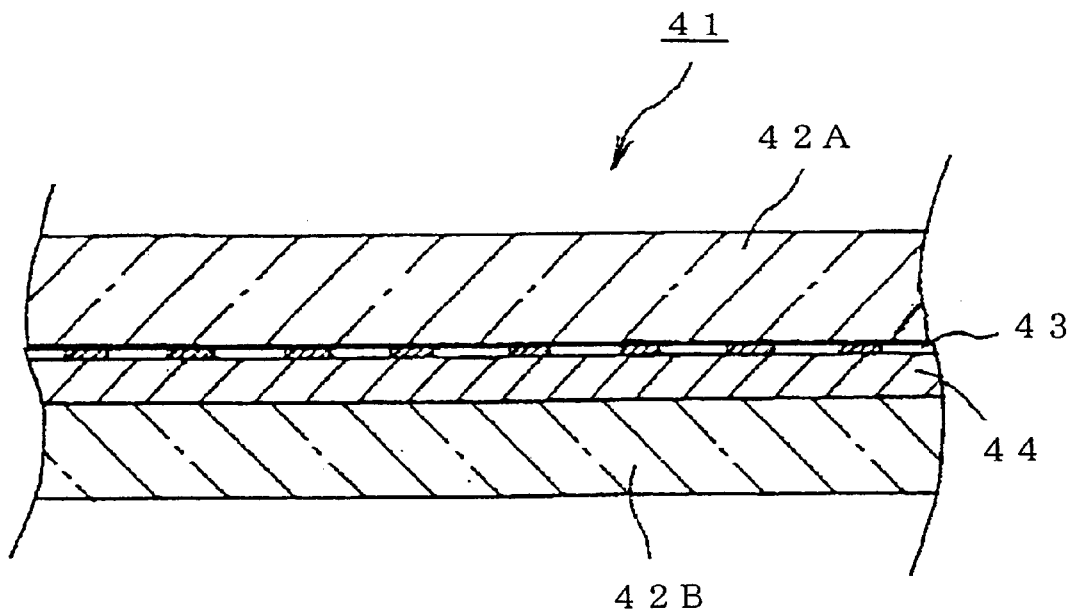
FIG. 4 is a schematic sectional view showing an embodiment of an electromagnetic-wave shielding and light transmitting plate according to the present invention.

FIG. 4 is a schematic sectional view showing an embodiment of an electromagnetic-wave shielding and light transmitting plate of the third aspect.

The electromagnetic-wave shielding and light transmitting plate 41 of FIG. 4 comprises two transparent base plates 42A, 42B and an adhesive layer 44 bonding them as an integral member. The transparent base plate 42A, one of the transparent base plates 42A, 42B, is provided with a pattern-etched metallic film 43 on a surface thereof at the adhesive layer 44 side.

The material for the transparent base plates 42A, 42B may be the same as used for the transparent base plates of the first aspect.

The thicknesses of the transparent base plates 42A, 42B are suitably determined in accordance with requirements (e.g. strength, light weight) due to the application of a plate to be obtained and are normally in a range from 0.05 to 5 mm.

The transparent base plates 42A, 42B are not necessarily made of the same material. For example, in a case of a PDP front filter in which only the front surface is required to have scratch resistance and durability, the transparent base plate 42A as the front surface may consist of a glass plate having a thickness of 1.0 to 4.0 mm and the transparent base plate 42B as the rear surface may consist of a PET board having a thickness of 0.05 to 0.3 mm.

The transparent base plate 42A as the front surface may be processed by hard coating with silicone oxide, soil resistant finish with polyvinylidene fluoride paint, AR (anti-reflection) coating with laminated layers of silicone dioxide layer and titanium dioxide layer, and/or anti-glare finish by hard coating including light-scattering agent or hard coating forming convexoconcaves to improve its function. On the other hand, the transparent base plate 42B as the rear surface may be processed by heat ray reflection coating with zinc oxide and silver film to improve its function.

Examples of metal of the metallic film include copper, stainless steel, chrome, aluminum, nickel, iron, brass, or alloy thereof. Preferably selected from the above are copper, stainless steel, aluminum, and chrome.

Such a metallic film may be formed on the transparent base plate by one of methods including electroless plating, vacuum evaporation, sputtering, and chemical vapor phase evaporation.

It is not preferable that the metallic film is too thin because it reduces the electromagnetic-wave shielding efficiency and it is also not preferable that the metallic film is too thick because it affects the thickness of the electromagnetic-wave shielding and light transmitting plate to be obtained and makes a time period for etching process longer. Therefore, the thickness of the metallic film is preferably in a range from 0.01 to 50 μm.

A method of pattern etching such a metal film may be any one of commonly used methods and is preferably a photo-etching using a resist. In this case, a resist pattern is formed by first coating the metallic foil with the photo-resist, exposing a pattern using a desired mask, and then developing the pattern. After that the metallic foil excepting places where the resist exists is removed by etchant such as ferric chloride.

The use of pattern etching can allow free designing of pattern so that the metallic film can be etched in any line width, space, and opening configuration, thereby allowing easy formation of an electromagnetic-wave shielding and light transmitting plate which never cause moiréphenomenon and has desired electromagnetic-wave shielding efficiency and light transparency.

The configuration of etching pattern of the metallic film is not particularly limited and the patterns as shown in FIGS. 3a–3f may be employed.

In order to ensure both the electromagnetic-wave shielding efficiency and the light transparency, the ratio of opening areas of the metallic film relative to the projected area of the metallic film (hereinafter, referred to as "open area ratio") is preferably in a range from 20 to 90%.

When the metallic film is designed to have a greater open area ratio in order to improve the light transparency, a transparent conductive layer may be formed onto the transparent base plate 42A or 42B to compensate a shortage of electromagnetic-wave shielding efficiency.

Though the metallic film 43 is formed on the rear surface of the transparent base plate 42A in FIG. 4, the metallic film 43 may be formed onto a surface of the transparent base plate 42B at the adhesive layer 44 side or the front surface of the transparent base plate 42A, or two of the aforementioned surfaces.

The resin of adhesive layer 44 for bonding the transparent base plates 42A, 42B may be the same as the resin of the adhesive layer 3 of the first aspect.

The electromagnetic-wave shielding and light transmitting plate 41 of FIG. 4 can be easily made by interposing the adhesive film, in which crosslinking agent for heat curing or photo-curing is mixed to a copolymer of ethylene series such as EVA, between the transparent base plates 42A and 42B onto which the pattern-etched metallic film 43 is previously formed, then decompressing and deaerating them under the heated condition, and hardening the adhesive layer by heating or irradiation to integrate them.

The thickness of the adhesive layer 44 can vary according to the application of the electromagnetic-wave shielding and light transmitting plate and is normally between 0.05 and 1.0 mm. Therefore, the adhesive film is formed to have a thickness from 0.05 to 1.0 mm to make an adhesive layer having such a thickness.

In the third aspect, the adhesive layer in which EVA is used as the copolymer of ethylene series is preferably the same as the adhesive layer of the second aspect.

Figure 5:
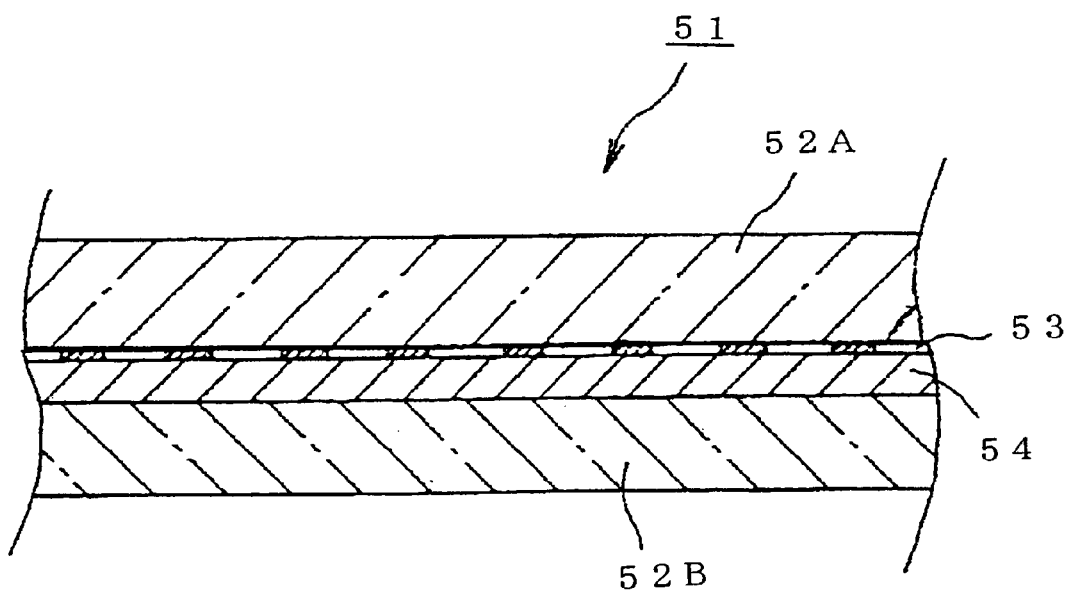
FIG. 5 is a schematic sectional view showing an embodiment of an electromagnetic-wave shielding and light transmitting plate according to the present invention.

FIG. 5 is a schematic sectional view showing an embodiment of an electromagnetic-wave shielding and light transmitting plate of the fourth aspect.

The electromagnetic-wave shielding and light transmitting plate 51 of FIG. 5 comprises two transparent base plates 52A, 52B and an adhesive layer 54 bonding them as an integral member. The transparent base plate 52A, one of the transparent base plates 52A, 52B, is provided with a conductive layer 53 on a surface thereof at the adhesive layer 54 side by pattern printing.

The material for the transparent base plates 52A, 52B may be the same as used for the transparent base plates of the first through third aspects.

The thicknesses of the transparent base plates 52A, 52B are suitably determined in accordance with requirements (e.g. strength, light weight) due to the application of a plate to be obtained and are normally in a range from 0.05 to 5 mm.

The transparent base plates 52A, 52B are not necessarily made of the same material. For example, in a case of a PDP front filter of which only the front surface is required to have scratch resistance and durability, the transparent base plate 52A as the front surface may consist of a glass plate having a thickness of 1.0 to 4.0 mm and the transparent base plate 52B as the rear surface may consist of a PET board having a thickness of 0.05 to 0.3 mm.

The transparent base plate 52A as the front surface may be processed by hard coating with silicone oxide, soil resistant finish with polyvinylidene fluoride paint, AR (anti-reflection) coating with laminated layers of silicone dioxide layer and titanium dioxide layer, and/or anti-glare finish by hard coating including light-scattering agent or hard coating forming convexoconcaves to improve its function. On the other hand, the transparent base plate 52B as the rear surface may be processed by heat ray reflection coating with zinc oxide and silver film to improve its function.

The conductive layer can be formed on the plate surface of the transparent base plate by screen process printing, ink jet printing or electrostatic printing, with conductive ink such as the following i) or ii).

i) Carbon black particles, or particles of metal such as copper, aluminum, or nickel or alloy thereof, of which particle size is 100 μm or less, with binder resin of PMMA, polyvinyl acetate, or epoxy resin, wherein the particles are dispersed in the binder resin such that the concentration of the particles is 50 to 90% by weight Such ink is diluted with or dispersed in solvent toluene, xylene, methylene chloride, or water to a suitable concentration, then applied onto the plate surface, and, if necessary, fixed on the plate surface by drying them at a temperature between a room temperature to 120° C.

ii) The same conductive particles as the above covered by binder resin. Such ink is directly applied onto the plate surface by the electrostatic printing and fixed by heating or the like.

It is not preferable that the printed layer thus formed is too thin because it reduces the electromagnetic-wave shielding efficiency and it is also not preferable that the printed layer is too thick because it affects the thickness of the electromagnetic-wave shielding and light transmitting plate to be obtained. Therefore, the thickness of the printed layer is preferably in a range from 0.5 to 100 μm.

The use of such pattern printing can provide a high degree of freedom for pattern so that the conductive layer can be obtained in any line width, space, and opening configuration, thereby allowing easy formation of an electromagnetic-wave shielding and light transmitting plate which never cause moiréphenomenon and has desired electromagnetic-wave shielding efficiency and light transparency.

In the fourth aspect, the configuration of pattern printing of the conductive layer is not particularly limited and the patterns as shown in FIGS. 3a–3f, may be employed.

In order to ensure the electromagnetic-wave shielding efficiency and the light transparency, the ratio of opening areas of the conductive layer relative to the projected area of the printed layer (hereinafter, referred to as "open area ratio") is preferably in a range from 20 to 90%.

When the conductive layer is designed to have a greater open area ratio in order to improve the light transparency, a transparent conductive layer may be formed onto the transparent base plate 52A or 52B to compensate a shortage of electromagnetic-wave shielding efficiency of the printed layer.

The resin of adhesive layer 54 for bonding the transparent base plates 52A, 52B may be the same as the resin of the adhesive layer 3 of the first aspect.

The electromagnetic-wave shielding and light transmitting plate 51 of FIG. 5 can be easily made by, interposing the adhesive film, in which crosslinking agent for heat curing or photo-curing is mixed to a copolymer of ethylene series such as EVA, between the transparent base plates 52A and 52B, wherein the conductive layer 53 is previously formed onto the transparent base plate 52A by the pattern printing, then decompressing and deaerating them under the heated condition, and hardening the adhesive layer by heating or irradiation to integrate them.

The thickness of the adhesive layer 54 can vary according to the application of the electromagnetic-wave shielding and light transmitting plate and is normally between 0.05 and 1.0 mm. Therefore, the adhesive film is formed to have a thickness from 0.05 to 1.0 mm to make an adhesive layer having such a thickness.

In the fourth aspect, the adhesive layer in which EVA is used as the copolymer of ethylene series is preferably the same as the adhesive layer of the second and third aspects.

Figure 6A:
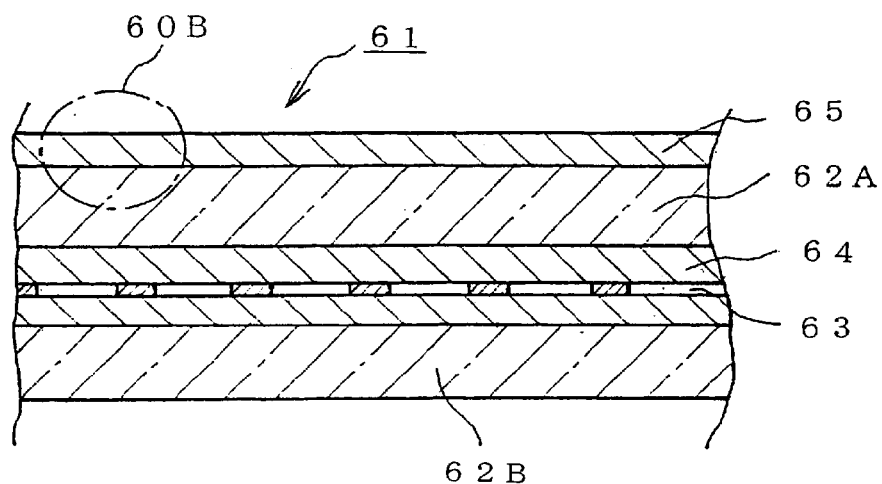
Figure 6B:
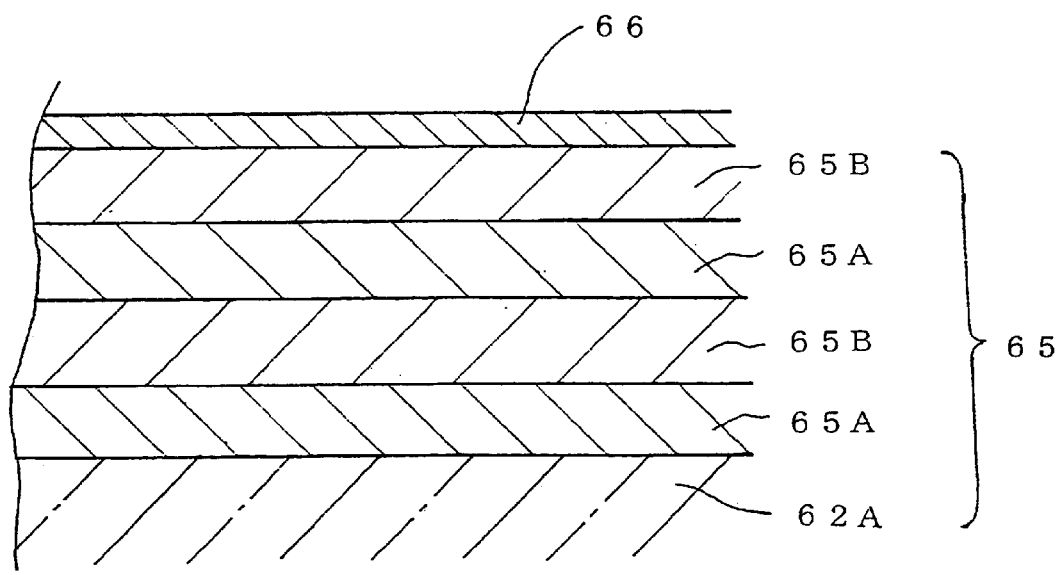

FIG. 6a is a schematic sectional view showing an embodiment of an electromagnetic-wave shielding and light transmitting plate of the fifth aspect and FIG. 6b is an enlarged view of a part 60B of FIG. 6a.

The electromagnetic-wave shielding and light transmitting plate 61 of FIG. 6a comprises two transparent base plates 62A, 62B, a conductive mesh member 63 interposed between the transparent base plates 62A and 62B, and adhesive layers 64 disposed between each transparent base plate 62A, 62B and the conductive mesh member 63 to bond them as an integral member. The transparent base plate 62A is provided with an antireflection film 65, which is a laminated film of a high-refractive transparent film 65A and a low-refractive transparent film 65B, on a surface thereof to be located at the opposite side of the electromagnetic wave source, i.e. an outer surface when the plate 61 is used as a front filter for a PDP.

The material for the transparent base plates 62A, 62B may be the same as used for the transparent base plates of the first through fourth aspects.

The thicknesses of the transparent base plates 62A, 62B are suitably determined in accordance with requirements (e.g. strength, light weight) due to the application of a plate to be obtained and are normally in a range from 0.1 to 10 mm.

The transparent base plates 62A, 62B are not necessarily made of the same material. For example, in a case of a PDP front filter in which only the front surface is required to have scratch resistance and durability, the transparent base plate 62A as the front surface may consist of a glass plate having a thickness of 0.1 to 10 mm and the transparent base plate 62B as the rear surface may consist of a PET film or PET board, an acrylic film or acrylic board, or a polycarbonate film or polycarbonate board, of which thickness is in a range from 1 μm to 10 mm.

The antireflection film 65 formed on the front surface of the transparent base plate 62A is a laminated film of the high-refractive transparent film 65A and the low-refractive transparent film 65B. In the illustrated embodiment, the antireflection film 65 is a multi-layer film consisting of two high-refractive transparent films 65A and two low-refractive transparent films 65B which are alternately laminated, i.e. four films, the sequence being first the high-refractive transparent film 65A, then the low-refractive transparent film 65B, the high-refractive transparent film 65A, and finally the low-refractive transparent film 65B. Besides such a structure as the illustrated embodiment, the antireflection film 65 may be as follows:

(a) a laminated film consisting of a high-refractive transparent film and a low-refractive transparent film, i.e. two films in total;

(b) a laminated film consisting of a medium-refractive transparent film, a high-refractive transparent film, and a low-refractive transparent film, i.e. three films in amount, the sequence being first the medium-refractive transparent film, then the high-refractive transparent film, and finally the low-refractive transparent film; and (c) a laminated film consisting of three high-refractive transparent films and three low-refractive transparent films which are alternately laminated, i.e. six films in total.

As the high-refractive transparent film, a film, preferably a transparent conductive film, having a refractive index of 1.8 or more can be made of ZnO, $TiO_2$, $SnO_2$, or ZrO in which ITO (tin indium oxide) or ZnO, Al is doped. On the other hand, as the low-refractive transparent film, a film can be made of low-refractive material having a refractive index of 1.6 or less such as $SiO_2$, $MgF_2$, or $Al_2O_3$. The thicknesses of the films vary according to the film structure, the film kind, and the central wavelength because the refractive index in a visible-light area is reduced by interference of light. In case of four-layer structure, the antireflection film is formed in such a manner that the first layer (high-refractive transparent film) is from 5 to 50 nm, the second layer (low-refractive transparent film) is from 5 to 50 nm, the third layer (high-refractive transparent film) is from 50 to 100 nm, and the fourth layer (low-refractive transparent film) is from 50 to 150 nm in thickness.

The antireflection film 65 is fisher formed with an antifouling film 66 to improve the fouling resistance of the surface. The antifouling film 66 is preferably a fluorocarbon or silicone film having a thickness in a range from 1 to 1000 nm.

The transparent base plate 62A as the front surface may be further processed by hard coating with silicone material and/or anti-glare finish by hard coating including light-scattering agent On the other hand, the transparent base plate 62B as the rear surface may be processed by heat ray reflection coating with a metallic film or a transparent conductive film to improve its function.

It is preferable that the conductive mesh member, made of metallic fibers and/or metal-coated organic fibers, to be interposed between the transparent base plates 62A and 62B has a wire diameter between 1 μm and 1 mm and an open area ratio between about 50% and about 90%. When the wire diameter is more than 1 mm, the open area ratio is reduced or the electromagnetic-wave shielding efficiency is reduced and it is impossible to satisfy both the open area ratio and the electromagnetic-wave shielding efficiency. When the wire diameter is less than 1 μm, it reduces the strength of the mesh member to make the handling significantly difficult. When the open area ratio is more than 90%, it is difficult to maintain the mesh configuration. On the other hand, when the open area ratio is less than 50%, too low light transmittance is provided so as to reduce the light from the display. It is more preferable that the wire diameter is between 10 and 500 μm and the open area ratio is between 60 and 90%.

The ratio of opening areas of the conductive mesh member means the ratio of areas, where the openings occupy, relative to the projected area of the conductive mesh member.

Examples of metal of metallic fibers and metal-coated organic fibers constituting the conductive mesh member include copper, stainless steel, aluminum, nickel, titanium, tungsten, tin, lead, iron, silver, chrome, carbon, or alloy thereof. Preferably selected from the above are copper, stainless steel, and aluminum.

Examples of organic material of the metal-coated organic fibers include polyester, nylon, vinylidene chloride, aramid, vinylon, and cellulose.

The resin of adhesive layer 64 for bonding the transparent base plates 62A, 62B via the conductive mesh member 63 may be the same as the resin of the adhesive layer 3 of the first aspect.

The electromagnetic-wave shielding and light transmitting plate 61 of the fifth aspect can be easily made by interposing two adhesive films, in which a suitable amount of crosslinking agent for heat curing or photo-curing is mixed to a resin such as EVA, and the conductive mesh member which is disposed therebetween, between the transparent base plates 62A and 62B, then decompressing and deaerating them under the heated condition, and hardening the adhesive layer by heating or irradiation to integrate them.

The thickness of the adhesive layer formed from the conductive mesh member 63 and the adhesive resins 64 can vary according to the application of the electromagnetic-wave shielding and light transmitting plate and is normally between 2 µm and 2 mm. Therefore, the adhesive film is formed to have a thickness from 1 µm to 1 mm to make an adhesive layer having such a thickness.

In the fifth aspect, the adhesive layer in which EVA is used as the resin is preferably the same as the adhesive layer of the second through fourth aspects.

Figure 7:
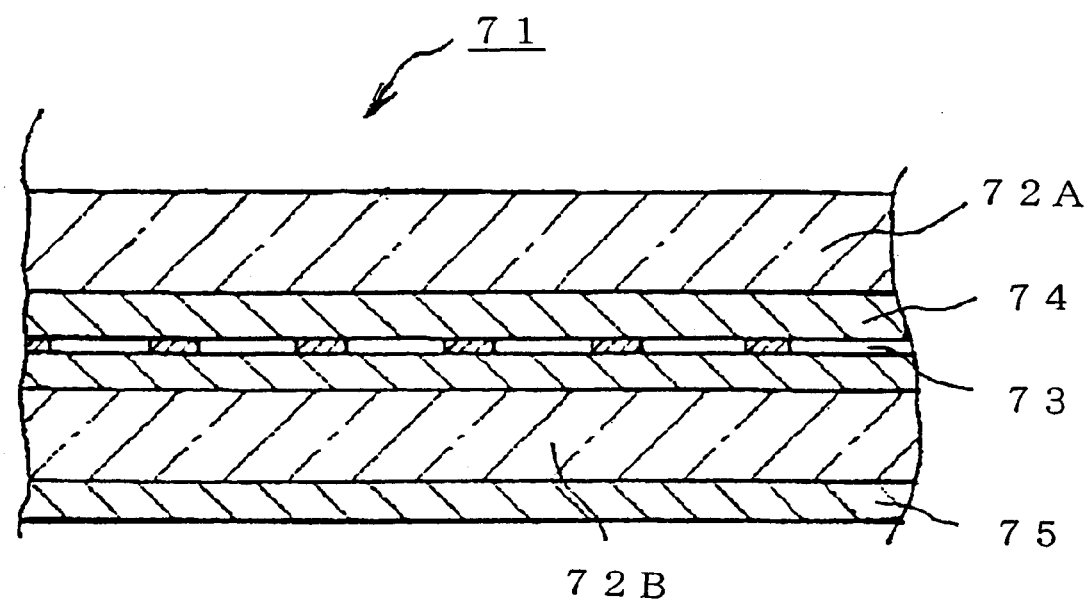
FIG. 7 is a schematic sectional view showing an embodiment of an electromagnetic-wave shielding and light transmitting plate according to the present invention.

FIG. 7 is a schematic sectional view showing an embodiment of an electromagnetic-wave shielding and light transmitting plate of the sixth aspect.

As shown in FIG. 7, the electromagnetic-wave shielding and light transmitting plate 71 of the sixth aspect comprises two transparent base plates 72A, 72B, a conductive mesh member 73 interposed between the transparent base plates 72A and 72B via adhesive resins 74 bonding the transparent base plates and the conductive mesh member as an integral member. The transparent base plate 72B is provided with a heat ray reflecting transparent conductive film 75 on a surface thereof to be located at the electromagnetic wave source side, i.e. an inner surface when the plate 71 to be obtained is used as a front filter for a PDP.

The material for the transparent base plates 72A, 72B may be the same as used for the transparent base plates of the first through fifth aspects.

The thicknesses of the transparent base plates 72A, 72B are suitably determined in accordance with requirements (e.g. strength, light weight) due to the application of a plate to be obtained and are normally in a range from 0.1 to 10 mm.

The transparent base plates 72A, 72B are not necessarily made of the same material. For example, in a case of a PDP front filter in which only the front surface is required to have scratch resistance and durability, the transparent base plate 72A as the front surface may consist of a glass plate having a thickness of 0.1 to 10 mm and the transparent base plate 72B as the rear surface may consist of a PET film or PET board, an acrylic film or acrylic board, or a polycarbonate film or polycarbonate board, of which thickness is in a range from 1 µm to 10 mm.

The heat ray reflecting transparent conductive film 75 formed on the surface of the transparent base plate 72B may be made of ZnO or $SnO_2$ in which ITO (tin indium oxide) or ZnO, Al is doped. The film may be a heat ray reflecting film which is thinly coated with a metallic film of silver or copper to have visible light transparency and which can reflect infrared light. The thicknesses of the film vary according to the electromagnetic-wave shielding efficiency, the light transparency, and the adiathermancy to be required. Normally, the thickness is preferably in a range from 10 Å to 5 µm in case of the metallic oxide film or in a range from 5 Å to 3,000 Å in the metallic film.

The transparent base plate 72A as the front surface may be further processed by hard coating with silicone material and/or anti-glare finish by hard coating including light-scattering agent to improve its function.

The conductive mesh member interposed between the transparent base plates 72A and 72B may be the same as used in the fifth aspect.

The resin of adhesive layer 74 for bonding the transparent base plates 72A, 72B via the conductive mesh member 73 may be the same as the resin of the adhesive layer 3 of the first aspect.

The electromagnetic-wave shielding and light transmitting plate of the sixth aspect can be easily made by interposing two adhesive films, in which a suitable amount of crosslinking agent for heat curing or photo-curing is mixed to a resin such as EVA, and the conductive mesh member which is disposed therebetween, between the transparent base plate 72A and the transparent base plate 72B which is previously formed with the transparent conductive film 75, then decompressing and deaerating them under the heated condition, and hardening the adhesive layer by heating or irradiation to integrate them.

The thickness of the adhesive layer formed from the conductive mesh member 73 and the adhesive resins 74 may be the same as that of the fifth aspect.

In the sixth aspect, the adhesive layer in which EVA is used as the resin is preferably the same as the adhesive layer of the second through fifth aspects.

Figure 8A:
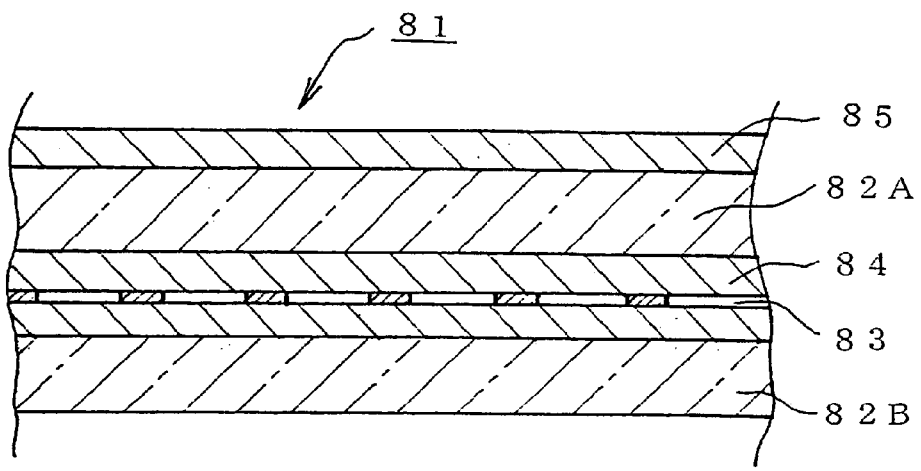
FIGS. 8a through 8c are schematic sectional views showing embodiments of the electromagnetic-wave shielding and light transmitting plate according to the present invention.
Figure 8B:
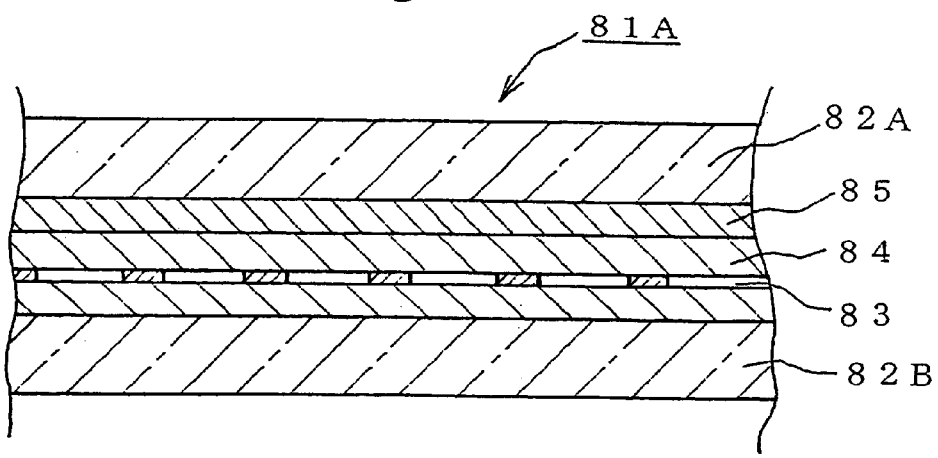
Figure 8C:
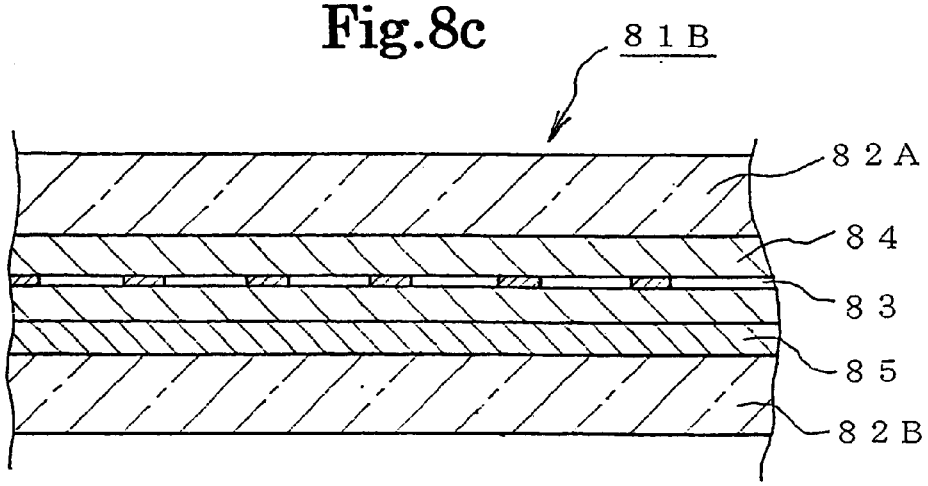

FIGS. 8a, 8b, 8c are schematic sectional views showing embodiments of the electromagnetic-wave shielding and light transmitting plate of the seventh aspect.

The electromagnetic-wave shielding and light transmitting plate 81 of FIG. 8a comprises two transparent base plates 82A, 82B, a conductive mesh member 83 interposed between the transparent base plates 82A and 82B via adhesive resins 84 bonding the transparent base plates and the conductive mesh member as an integral member. The transparent base plate 82A is provided with a transparent conductive film 85 on a surface thereof to be located at the opposite side of the electromagnetic wave source, i.e. the outer surface when the plate 81 is used as a front filter for a PDP.

The electromagnetic-wave shielding and light transmitting plate 81A of FIG. 8b comprises two transparent base plates 82A, 82B, a conductive mesh member 83 interposed between the transparent base plates 82A and 82B via adhesive resins 84 bonding the transparent base plates and the conductive mesh member as an integral member. The transparent base plate 82A located at the opposite side of the electromagnetic wave source is provided with a transparent conductive film 85 on a surface thereof facing the adhesive resin.

The electromagnetic-wave shielding and light transmitting plate 81B of FIG. 8c comprises two transparent base plates 82A, 82B, a conductive mesh member 83 interposed between the transparent base plates 82A and 82B via adhesive resins 84 bonding the transparent base plates and the conductive mesh member as an integral member. The transparent base plate 82B located at the electromagnetic wave source side is provided with a transparent conductive film 85 on a surface thereof facing the adhesive resin.

Such a transparent conductive film 85 may be provided on the outer surface (at the electromagnetic wave source side) of the transparent base plate 82B, but not illustrated.

Transparent conductive films 85 may be provided on two or more of the aforementioned surfaces of the transparent base plates 82A, 82B, respectively.

The material for the transparent base plates 82A, 82B may be the same as used for the transparent base plates of the first through sixth aspects.

The thicknesses of the transparent base plates 82A, 82B are suitably determined in accordance with requirements (e.g. strength, light weight) due to the application of a plate to be obtained and are normally in a range from 0.1 to 10 mm.

The transparent base plates 82A, 82B are not necessarily made of the same material. For example, in a case of a PDP front filter in which only the front surface is required to have scratch resistance and durability, the transparent base plate 82A as the front surface may consist of a glass plate having a thickness of 0.1 to 10 mm and the transparent base plate 82B as the rear surface may consist of a PET film or PET board, an acrylic film or acrylic board, or a polycarbonate film or polycarbonate board, of which thickness is in a range from 1 $\mu$m to 10 mm.

The transparent conductive film 85 may be the same as the transparent conductive film 75 of the sixth aspect For the electromagnetic-wave shielding and light transmitting plate of the seventh aspect, the transparent base plate 82A as the front surface may be further processed by hard coating with silicone material and/or anti-glare finish by hard coating including light-scattering agent. The transparent base plate 82B as the rear surface may be surfaced by heat ray reflecting coating of ITO, ZnO, or silver to improve its function.

The conductive mesh member interposed between the transparent base plates 82A and 82B may be the same as used in the fifth aspect.

The resin of adhesive layer 84 for bonding the transparent base plates 82A, 82B via the conductive mesh member 83 may be the same as used in the first aspect.

The electromagnetic-wave shielding and light transmitting plate of the seventh aspect can be easily made by previously forming the tandent conductive film 85 on a place or places of the transparent base plates 82A, 82B as needed, interposing two adhesive films, in which a suitable amount of crosslinking agent for heat curing or photo-curing is mixed to a resin such as EVA, and the conductive mesh member which is disposed therebetween, between the transparent base plates 82A and 82B, then decompressing and deaerating them under the heated condition, and hardening the adhesive layer by heating or irradiation to integrate them.

The thickness of the adhesive layer formed from the conductive mesh member 83 and the adhesive resins 84 may be the same as that of the fifth aspect.

In the seventh aspect, the adhesive layer in which EVA is used as the resin is the same as the adhesive layer of the second trough sixth aspects.

Figure 9:
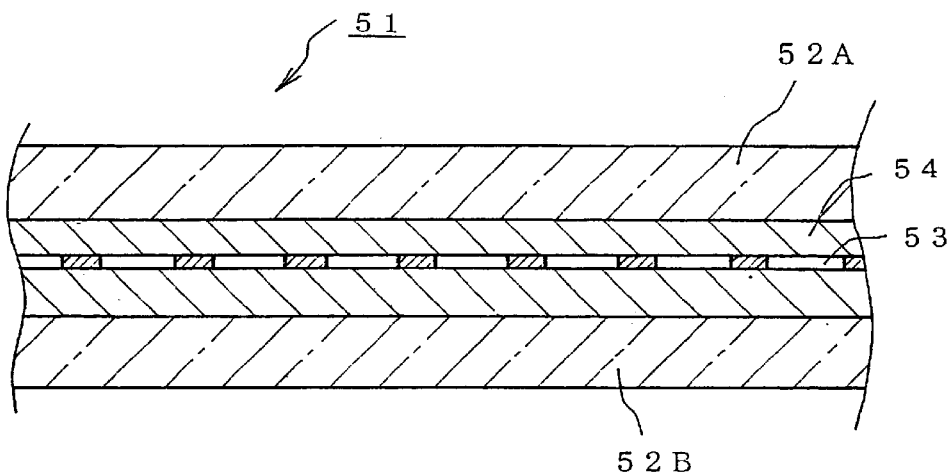
FIG. 9 is a schematic sectional view showing an embodiment of the electromagnetic-wave shielding and light transmitting plate according to the present invention.
Figure 10:
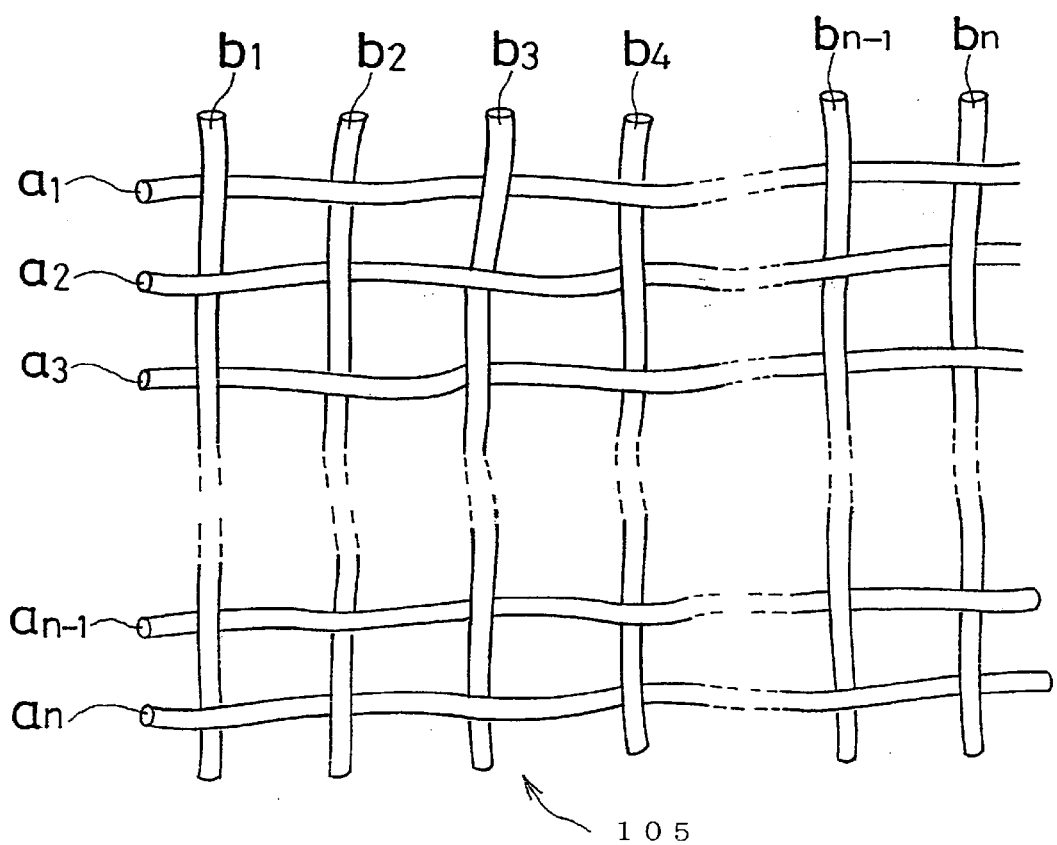
FIG. 10 is an enlarged schematic view showing fibers of a composite mesh member according to the present invention.

FIG. 9 is a schematic sectional view showing an embodiment of an electromagnetic-wave shielding and light transmitting plate of an eighth aspect and FIG. 10 is an enlarged schematic view showing fibers of a composite mesh member.

As shown in FIG. 9, the electromagnetic-wave shielding and light transmitting plate 91 of the eighth aspect comprises two transparent base plates 92A, 92B, a conductive mesh member 93 interposed between the transparent base plates 92A and 92B via adhesive resins 94 bonding the transparent base plates and the conductive mesh member as an integral member.

The material for the transparent base plates 92A, 92B may be the same as used for the transparent base plates of the first through seventh aspects.

The thicknesses of the transparent base plates 92A, 92B are suitably determined in accordance with requirements (e.g. strength, light weight) due to the application of a plate to be obtained and are normally in a range from 0.1 to 10 mm.

The transparent base plates 92A, 92B are not necessarily made of the same material. For example, in a case of a PDP front filter in which only the front surface is required to have scratch resistance and durability, the transparent base plate 92A as the front surface may consist of a glass plate having a thickness of 0.1 to 10 mm and the transparent base plate 92B as the rear surface may consist of a PET film or PET board, an acrylic film or acrylic board, or a polycarbonate film or polycarbonate board, of which thickness is in a range from 1 $\mu$m to 1 mm.

The transparent base plate 92A as the front surface may be further processed by hard coating with silicone material, soil resistant finish with fluoride material, AR (anti-reflection) coating with laminated layers of dioxide layer, and/or anti-glare finish by hard coating including light-scattering agent to improve its function. The transparent base plate 92B as the rear surface may be surfaced by heat ray reflecting coating of ITO, ZnO, or silver to improve its function.

Either one or both of the transparent base plates 92A and transparent base plate 92B may be formed with a transparent conductive film. In this case, the transparent conductive film compensates the electromagnetic-wave shielding efficiency of the conductive mesh member described later so as to provide the improved electromagnetic-wave shielding efficiency.

The transparent conductive film formed on the transparent base plates 92A, 92B is preferably a thin film made of ITO (tin indium oxide) or ZnO and having a thickness in a range of 0.01 to 1 $\mu$m.

The following are examples of the conductive mesh member to be interposed between the transparent base plates 92A and 92B in this aspect.

I. A conductive mesh member made of metallic fibers and having a wire diameter between 1 and 200 $\mu$m and an open area ratio between 30 and 99.9%.

As for this conductive mesh member a reduced open area ratio is provided when the wire diameter is more than 200 $\mu$m, the configuration can not be maintained when the wire diameter is less than 1 $\mu$m with a small mesh size, and ba reduced open area ratio is also provided when the wire diameter is less than 1 $\mu$m with a large mesh size. No shielding efficiency is provided when the open area ratio is 100%, and the luminance from an emitter such as a CRT is reduced when the open area ratio is less than 30%. It is preferable that the wire diameter is between 5 and 100 $\mu$m and the open area ratio is between 40 and 90%.

II. A conductive mesh member made of metallic fibers and having a wire diameter between 1 and 200 $\mu$m and an open area ratio between 30 and 99.9%.

As for this conductive mesh member a reduced open area ratio is provided when the wire diameter is more than 200 $\mu$m, the configuration can not be maintained when the wire diameter is less than 1 $\mu$m with a small mesh size, and a reduced open area ratio is also provided when the wire diameter is less than 1 $\mu$m with a large mesh size. No shielding efficiency is provided when the open area ratio is 100%, and the luminance from an emitter such as a CRT is reduced when the open area ratio is less than 30%. It is preferable that the wire diameter is between 5 and 100 $\mu$m and the open area ratio is between 40 and 90%.

III. A conductive composite mesh member in which metallic fibers and/or metal-coated organic fibers and organic fibers are woven.

As for this conductive mesh member a reduced open area ratio is provided when the wire diameter is more than 200 $\mu$m, the configuration can not be maintained when the wire diameter is less than 1 $\mu$m with a small mesh size, and a reduced open area ratio is also provided when the wire diameter is less than 1 $\mu$m with a large mesh size. It is preferable that the wire diameter is between 1 and 200 $\mu$m and more preferable that it is between 5 and 100 μm. No shielding efficiency is provided when the open area ratio is 100%, and the luminance from an emitter such as a CRT is reduced when the open area ratio is less than 30%. It is preferable that the open area ratio is between 30 and 99.9% and more preferable that it is between 40 and 90%.

The metallic fibers constituting the conductive mesh member used in the above I and II and the metal-coated organic fibers constituting the conductive mesh member used in the above II and III are the same as used in the fifth through seventh aspects.

The ratio of the metallic fibers and/or the metal-coated fibers and the organic fibers is preferably, Metallic fibers and/or Metal-coated fibers: Organic fibers=1:1–1:10 (ratio by the number of fibers).

Therefore, the conductive composite mesh member is formed by weaving the metallic fibers and/or the metal-coated fibers and the organic fibers at the above ratio in such a manner that these fibers are dispersed uniformly.

Following are examples of fiber patterns of the conductive composite mesh member 95 and will be described with reference to FIG. 10.

(i) $a_1, a_3, \ldots a_{2m+1}$ and $b_1, b_3, \ldots b_{2m+1}$=Metallic fibers and/or Metal-coated fibers, $a_2, a_4, \ldots a_{2m}$ and $b_2, b_4, \ldots b_{2m}$=Organic fibers;

(ii) $a_1, a_4, \ldots a_{3m+1}$ and $b_1, b_4, \ldots b_{3m+1}$=Organic fibers, others=Metallic fibers and/or Metal-coated fibers; and (iii) $a_1, a_4, \ldots a_{3m+1}$ and $b_1, b_4, \ldots b_{3m+1}$=Metallic fibers and/or Metal-coated fibers, others=Organic fibers.

The resin 94 of adhesive layer for bonding the transparent base plates 92A, 92B via the conductive mesh member 93 may be the same as the resin of the adhesive layer 3 of the first aspect.

The electromagnetic-wave shielding and light transmitting plate of the eighth aspect can be easily made by interposing two adhesive films, in which a suitable amount of crosslinking agent for heat curing or photo-curing is mixed to a resin such as EVA, and the conductive mesh member which is disposed therebetween, between the transparent base plates 92A and 92B, then decompressing and deaerating them under the heated condition, and hardening the adhesive layer by heating or irradiation to integrate them.

The thickness of the adhesive layer formed from the conductive mesh member 93 and the adhesive resins 94 may be the same as that of the fifth aspect.

In the eighth aspect, the adhesive layer in which EVA is used as the resin is preferably the same as the adhesive layer of the second through seventh aspects.

EXAMPLES

Hereinafter, the first aspect will be more concretely described by means of examples and comparative examples.

Adhesive sheets used in the examples and comparative examples were made as follows.

Adhesive Sheet

Each adhesive sheet was made in such a way that 1 part by weight of 1,1-bis (tert-butyl-peroxy)-3,3,5-trimethylcyclohexane (Perhexa 3M available from NOF Corporation), 0.1 part by weight of γ-methacryloxypropyl trimethoxy silane, 2 parts by weight of diallyl phthalate, 0.5 part by weight of Sumisolve (available from Sumitomo Chemical Company, Limited.) as ultraviolet absorbing agent, and conductive particles specified in Table 1 at a ratio specified in Table 1 (no conductive particle in Comparative Examples 1 through 3) were added into and mixed with 100 parts by weight of ethylene-vinyl acetate copolymer (Ultrasen 634 available from Tosoh Corporation: 26% content of vinyl acetate, Melt index 4) and the resultant mixture was extruded by a 40 mm extruder so that an adhesive sheet having a thickness of 0.1 mm with the both surfaces being embossed was provided.

Examples 1 through 4,

Comparative Examples 1 through 3

Used as the front transparent base plate 2A was a glass plate having a thickness of 3.0 mm and used as the rear transparent base plate 2B was a PET sheet having a thickness of 0.1 mm these plates having an adhesive sheet posed therebetween were entered into a rubber bag which was then vacuumed to be deaerated and pre-compressed by beating them at 85° C. for 15 minutes. After that, the object thus pre-compressed was entered into an oven and heated at 150° C. for 15 minutes so that it is crosslinked and hardened to be integrated.

In each of Comparative Examples 2, 3 and Examples 3, 4, a conductive mesh member specified in Table 1 was further interposed between the transparent base plates before integrated.

The resultant plate were measured for the respective electromagnetic-wave shielding effect in a range between 30 MHz and 300 MHz, its light transmittance, and its visibility (the presence or absence of moiré phenomenon) in the following manner. The results are tabulated in Table 1.

Electromagnetic-Wave Shielding Effect

The attenuance of field of each sample was measured using EMI shield measuring equipment available from Anritsu Corporation in conformity with KEC measurement (Kansai Electronic Industrial Promotion Center). The size of the sample was 90 mm ×110 mm.

Light Transmittance (%)

The average light transmittance in a range between 380 nm and 780 nm was measured using a visible ultraviolet spectrophotometer (U-4000) available from Hitachi Ltd.

Visibility

Each resultant plate was mounted on a display and it was then observed by the human eye whether interference fringe appeared on the display.

TABLE 1

| Examples | Conductive Particles | | Conductive Mesh Member | Electromagnetic Shielding Efficiency (dB) | | | Light Transmittance (%) | Visibility |
| | Type | Mixing rate (% by weight) | | 30 MHz | 100 MHz | 300 MHz | | |
| --- | --- | --- | --- | --- | --- | --- | --- | --- |
| Comparative Example 1 | — | 0 | None | 24 | 14 | 3 | 92 | Good |
| Example 1 | A | 2 | None | 40 | 29 | 18 | 60 | Good |
| Example 2 | B | 0.5 | None | 42 | 30 | 19 | 35 | Good |

TABLE 1-continued

| Examples | Conductive Particles Type | Mixing rate (% by weight) | Conductive Mesh Member | Electromagnetic Shielding Efficiency (dB) 30 MHz | 100 MHz | 300 MHz | Light Transmittance (%) | Visibility |
|---|---|---|---|---|---|---|---|---|
| Comparative Example 2 | — | 0 | Stainless Steel #17 ※2 | 43 | 33 | 23 | 80 | Good |
| Example 3 | A | 2 | Stainless Steel #17 | 62 | 55 | 40 | 48 | Good |
| Example 4 | B | 0.5 | Stainless Steel #17 | 62 | 56 | 41 | 29 | Good |
| Comparative Example 3 | — | 0 | Stainless Steel #165 ※3 | 63 | 62 | 57 | 45 | Bad(moiré) |

※1 A:polystyrene particles of 0.1 mm, plated by Ni
B: conductive carbon particles
※2 wire diameter 0.14 mm, open area ratio 82%
※3 wire diameter 0.05 mm, open area ratio 46%

It is apparent from Table 1 that good electromagnetic-wave shielding and light transmitting plates can be provided according to the first aspect of the present invention.

Hereinafter, the second aspect will be more concretely described by means of examples and comparative examples.

Adhesive films used in the examples and comparative examples were made in the same way as the first aspect.

Examples 5, 6

Used as the front transparent base plate 12A was a glass plate having a thickness of 3.0 mm and used as the rear transparent base plate 12B was a PET sheet having a thickness of 0.1 mm. These plates 12A, 12B having a metallic film specified in Table 2 interposed between two adhesive sheets which were interposed between the plates were entered into a rubber bag which was then vacuumed to be deaerated and pre-compressed by heating them at 85° C. for 15 minutes. After that, the object thus pre-compressed was entered into an oven and heated at 150 ° C for 15 minutes so that it is crosslinked and hardened to be integrated.

The resultant plate was measured for its electromagnetic-wave shielding effect in a range between 30 MHz and 300 MHz, its light transmittance, and its visibility (the presence or absence of moiré phenomenon) in the same manner as the fist aspect The results are tabulated in Table 2.

Comparative Examples 4 through 6

Electromagnetic-wave shielding and light transmitting plates were made in the same manner as Example 5 but not using such a pattern-etched metallic foil or using a metal mesh specified in Table 3 instead of such a metallic foil. The characteristics were measured in the same manner and the results are tabulated in Table 3.

TABLE 2

Figure 3D:
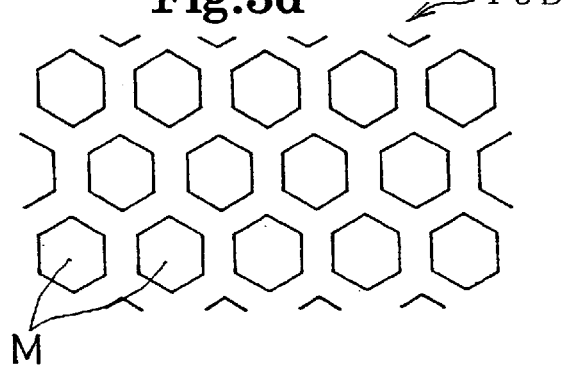
Figure 3E:
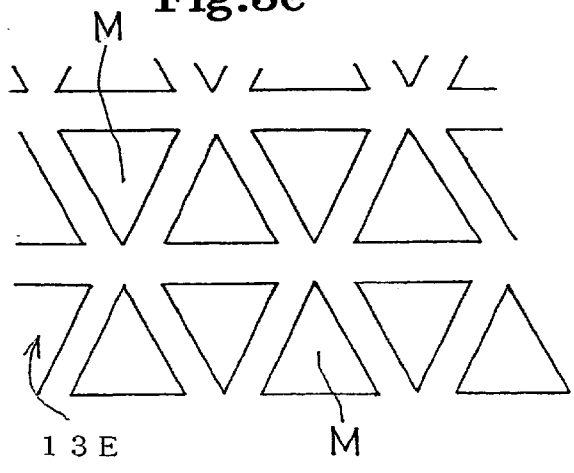
Figure 3F:
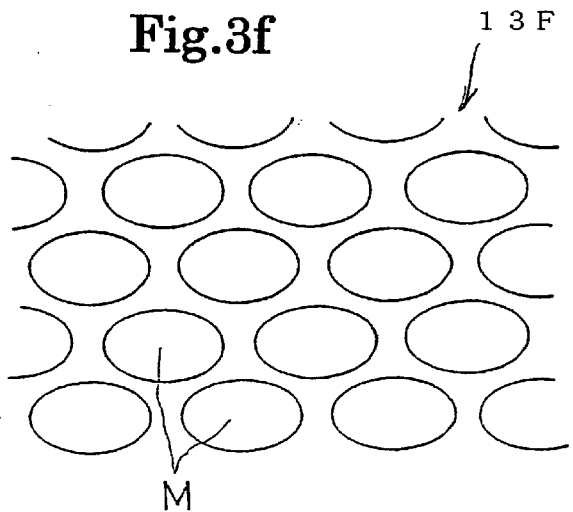

| Examples | Pattern-etched Metallic Film Metal | Pattern Configuration | Details of Pattern Configuration | Electromagnetic Shielding Efficiency (dB) 30 MHz | 100 MHz | 300 MHz | Light Transmittance (%) | Visibility |
|---|---|---|---|---|---|---|---|---|
| Example 5 | Copper | Configuration shown in FIG. 3a | Thickness:100 μm Line Width:0.2 mm Pitch:2.0 mm Open Area Ratio:83% | 45 | 34 | 24 | 76 | Good |
| Example 6 | Stainless Steel | Configuration shown in FIG. 3d | Thickness:100 μm Line Width:0.2 mm A side of Hexagon:1.0 mm Open Area Ratio:80% | 51 | 39 | 28 | 73 | Good |

TABLE 3

| Examples | Conductive Mesh Member | Electromagnetic Shielding Efficiency (dB) 30 MHz | 100 MHz | 300 MHz | Light Transmittance (%) | Visibility |
|---|---|---|---|---|---|---|
| Comparative Example 4 | None | 24 | 14 | 3 | 92 | Good |
| Comparative Example 5 | Stainless Steel Mesh #17 Wire Diameter:0.14 mm Open Area Ratio:82% | 43 | 33 | 23 | 80 | Good |
| Comparative Example 6 | Stainless Steel Mesh #165 Wire Diameter:0.05 mm Open Area Ratio:46% | 63 | 62 | 57 | 45 | Bad (moiré) |

It is apparent from Table 2 and Table 3 that good electromagnetic-wave shielding and light transmitting plates can be provided according to second aspect.

Hereinafter, the third aspect will be more concretely described by means of examples and comparative examples.

Adhesive films used in the examples and comparative examples were made in the same way as the first aspect

Examples 7, 8

Used as the front transparent base plate 42A was a glass plate having a thickness of 3.0 mm which was formed with a metallic film of metal specified in Table 4 on one surface thereof and then pattern etched in patterns specified in Table 4. Used as the rear transparent base plate 42B was a PET sheet having a thickness of 0.1 mm.

These plates 42A, 42B having an adhesive film interposed therebetween were entered into a rubber bag which was then vacuumed to be deaerated and pre-compressed by heating them at 85° C. for 15 minutes. After that, the object thus pre-compressed was entered into an oven and heated at 150° C. for 15 minutes so that it is crosslinked and hardened to be integrated.

The resultant plate was measured for its electromagnetic-wave shielding effect in a range between 30 MHz and 300 MHz, its light transmittance, and its visibility (the presence or absence of moiréphenomenon) in the same manner as the first aspect. The results are tabulated in Table 4.

Comparative Example 7

An electromagnetic-wave shielding and light transmitting plate was made in the same manner as Example 7 but not forming such a metallic film on the transparent base plate 42A. The characteristics were measured in the same manner and the results are tabulated in Table 5.

Comparative Examples 8, 9

Electromagnetic-wave shielding and light transmitting plates were made in the same manner as Example 7 but not forming such a metallic film on the transparent base plate 42A and interposing a copper net specified in Table 5 between the two transparent base plates. The characteristics were measured in the same manner and the results are tabulated in Table 5.

TABLE 4

| | Pattern-etched Metallic Film | | | Electromagnetic Shielding Efficiency (dB) | | | Light | |
|---|---|---|---|---|---|---|---|---|
| Examples | Metal | Pattern Configuration | Details of Pattern Configuration | 30 MHz | 100 MHz | 300 MHz | Transmittance (%) | Visibility |
| Example 7 | Copper ※1 (5 μm) | Configuration shown in FIG. 3a | Line Width:0.2 mm Pitch:2.0 mm Open Area Ratio:83% | 45 | 34 | 23 | 75 | Good |
| Example 8 | Chrome ※2 (0.2 μm) | Configuration shown in FIG. 3d | Line Width:0.1 mm Short Side of Opening:0.4 mm Long Side of Opening:20 mm Open Area Ratio:79% | 62 | 55 | 40 | 72 | Good |

※1:Electroless Plating
※2: Sputtering

TABLE 5

| | Conductive Mesh | Electromagnetic Shielding Efficiency (dB) | | | Light Transmittance | |
|---|---|---|---|---|---|---|
| Examples | Member | 30 MHz | 100 MHz | 300 MHz | (%) | Visibility |
| Comparative Example 7 | None | 24 | 14 | 3 | 92 | Good |
| Comparative Example 8 | Stainless Steel Mesh #17 Wire Diameter:0.14 mm Open Area Ratio:82% | 43 | 33 | 23 | 80 | Good |
| Comparative Example 9 | Stainless Steel Mesh #165 Wire Diameter:0.05 mm Open Area Ratio:46% | 63 | 62 | 57 | 45 | Bad (moiré) |

It is apparent from Table 4 and Table 5 that good electromagnetic-wave shielding and light transmitting plates can be provided according to the third aspect.

Hereinafter, the fourth aspect will be more concretely described by means of examples and comparative examples.

Adhesive films used in the examples and comparative examples were made in the same way as the first aspect.

Examples 9 and 10

Used as the front transparent base plate 52A was a glass plate having a thickness of 3.0 mm and used as the Tear transparent base plate 52B was a PET sheet having a thickness of 0.1 mm. The transparent base plate 52A was formed with a conductive layer 53 on one surface thereof by printing a pattern specified in Table 6 with conductive ink specified in Table 6. These plates 52A, 52B having an adhesive film interposed therebetween were entered into a rubber bag which was then vacuumed to be deaerated and pre-compressed by heating them at 85° C. for 15 minutes. After that, the object thus pre-compressed was entered into an oven and heated at 150° C. for 15 minutes so that it is crosslinked and hardened to be integrated.

The resultant plate was measured for its electromagnetic-wave shielding effect in a range between 30 MHz and 300 MHz, its light transmittance, and its visibility (the presence or absence of moiré phenomenon) in the same manner as the first aspect. The results are tabulated in Table 6.

Comparative Example 10

An electromagnetic-wave shielding and light transmitting plate was made in the same manner as Example 9 but not printing such a pattern on the transparent base plate 52A. The characteristics were measured in the same manner and the results are tabulated in Table 7.

Comparative Examples 11 and 12

Electromagnetic-wave shielding and light transmitting plates were made in the same manner as Example 9 but not printing such a pattern on the transparent base plate 52A and interposing a conductive mesh member specified in Table 7 between the transparent base plates 52A and 52B. The characteristics were measured in the same manner and the results are tabulated in Table 7.

TABLE 6

| Examples | Conductive Ink | Pattern Configuration | Details of Pattern Configuration | Electromagnetic Shielding Efficiency (dB) | | | Light Transmittance (%) | Visibility |
| --- | --- | --- | --- | --- | --- | --- | --- | --- |
| | | | | 30 MHz | 100 MHz | 300 MHz | | |
| Example 7 | A | Configuration shown in FIG. 2a | Line Width:0.2 mm Pitch:2.0 mm Open Area Ratio:83% | 45 | 34 | 22 | 74 | Good |
| Example 8 | B | Configuration shown in FIG. 2b | Line Width:0.1 mm Short Side of Opening:0.4 mm Long Side of Opening:20 mm Open Area Ratio:79% | 61 | 54 | 38 | 71 | Good |

A: This ink is produced by dispersing 75% by weight of conductive carbon into PMMA and diluting them by two times their volumes of toluene. The ink is printed by means of offset printing and then dried by air.
B: This ink is produced by dispersing 82% by weight of silver powder into epoxy resin containing diamine hardener and adjusting its viscosity with a small amount of toluene. The ink is printed by means of offset printing, then dried by air, and after that, hardened at the room temperature.

TABLE 7

| Examples | Conductive Mesh Member | Electromagnetic Shielding Efficiency (dB) | | | Light Transmittance (%) | Visibility |
| --- | --- | --- | --- | --- | --- | --- |
| | | 30 MHz | 100 MHz | 300 MHz | | |
| Comparative Example 10 | None | 24 | 14 | 3 | 92 | Good |
| Comparative Example 11 | Stainless Steel Mesh #17 Wire Diameter:0.14 mm Open Area Ratio:82% | 43 | 33 | 23 | 80 | Good |
| Comparative Example 12 | Stainless Steel Mesh #165 Wire Diameter:0.05 mm Open Area Ratio:46% | 63 | 62 | 57 | 45 | Bad (moiré) |

It is apparent from Table 6 and Table 7 that good electromagnetic-wave shielding and light transmitting plates can be provided according to the fourth aspect.

Hereinafter, the fifth aspect will be more concretely described by means of examples and comparative examples.

Adhesive films used in the examples and comparative examples were made in the same way as the first aspect

Examples 11 and 12,

Comparative Example 13

Used as the front transparent base plate 62A was a glass plate having a thickness of 3.0 mm which was formed with an antireflection film A or B (details are shown in Table 8) on a surface thereof (no antireflection film in Comparative Example 13) and used as the rear transparent base plate 62B was a PET sheet having a thickness of 0.1 mm. These plates 62A, 62B having a conductive mesh member specified in Table 9 interposing between two adhesive films which were interposed between the plates 62A and 62B, were entered into a rubber bag which was then vacuumed to be deaerated and pre-compressed by heating them at 90° C. for 10 minutes. After that, the object thus pre-compressed was entered into an oven and heated at 150° C. for 15 minutes so that it is crosslinked and hardened to be integrated.

The resultant plate was measured for its electromagnetic-wave shielding effect in a range between 30 MHz and 300 MHz, its light transmittance, and the presence or absence of moiré phenomenon in the same manner as the first aspect, and its visibility of display images during receiving incident light in the following manner. The results are tabulated in Table 9.

Visibility of Display Images During Receiving Incident Light

The visibility was measured by injecting artificial light beam or sunbeam obliquely at 30 degree from the perpendicular of the display and, in this state, observing obliquely at 30 on the opposite side whether images on the display was perceived.

TABLE 8

| Antireflection Film | Structure | | Material | Thickness (Å) |
|---|---|---|---|---|
| A | Four-layer laminated film in which two ITO films and two SiO$_2$ films are alternatively laminated | Forth layer | SiO$_2$ | 860 |
| | | Third layer | ITO | 1250 |
| | | Second layer | SiO$_2$ | 300 |

TABLE 8-continued

| Antireflection Film | Structure | | Material | Thickness (Å) |
|---|---|---|---|---|
| | | First layer | ITO | 150 |
| B | Four-layer laminated film in which two TiO$_2$ films and two SiO$_2$ films are alternatively laminated | Forth layer | SiO$_2$ | 860 |
| | | Third layer | TiO$_2$ | 1090 |
| | | Second layer | SiO$_2$ | 250 |
| | | First layer | TiO$_2$ | 150 |

TABLE 9

| Examples | | Antireflection Film to be used with Conductive Mesh Member | Conductive Mesh Member Metallic Fibers Material | Wire Diameter (mm) | Open Area Ratio (%) | Electromagnetic Shielding Efficiency (dB) 30 MHz | 100 MHz | 300 MHz | Light Transmittance (%) | Visibility of display images during receiving incident light |
|---|---|---|---|---|---|---|---|---|---|---|
| Example | 11 | Antireflection Film A | Stainless Steel | 0.14 | 82 | 62 | 55 | 40 | 72 | Good |
| | 12 | Antireflection Film B | Stainless Steel | 0.14 | 82 | 44 | 34 | 24 | 75 | Good |
| Comparative Example | 13 | None | Stainless Steel | 0.14 | 82 | 43 | 33 | 23 | 80 | Not perceived due to the effect of reflected light |

It is apparent from Table 9 that good electromagnetic-wave shielding and light transmitting plates can be provided according to the fifth aspect.

In the test with Comparative Example 13 having no antireflection film, the images on the display could not be perceived by the human eye because of the effect of reflected light of the incident light on the opposite side. On the other hand, in the tests with Examples 11 and 12 laminated with the antireflection film, the images on the display were not affected by the incident light and therefore could be perceived by the human eye.

Hereinafter, the sixth aspect will be more concretely described by means of examples and comparative examples.

Adhesive films used in the examples and comparative examples were made in the same way as the first aspect.

Examples 13 and 14,

Comparative Example 14

Used as the front transparent base plate 72A was a glass plate having a thickness of 3.0 mm and used as the rear transparent base plate 72B was a PET sheet having a thickness of 0.1 mm. The transparent base plate 72B was formed with a heat ray reflecting transparent conductive film 75 specified in Table 10 (no transparent conductive film in Comparative Example 14) on an opposite surface of the adhesive surface. A conductive mesh member specified in Table 10 was interposed between two adhesive films which were then interposed between the plates 72A, 72B. These were entered into a rubber bag which was then vacuumed to be deaerated and pre-compressed by heating them at 90° C. for 10 minutes. After that, the object thus pre-compressed was entered into an oven and heated at 150° C. for 15 minutes so that it is crosslinked to be integrated.

The resultant plate was measured for its electromagnetic-wave shielding effect in a range between 30 MHz and 300 MHz and its light transmittance in the same manner as the first aspect and was measured for its adiathermancy in the following manner. The results are tabulated in Table 10.

Adiathermancy

The evaluation of the adiathermancy was judged according to the temperature difference between the surface temperature of the center of the display and the surface temperature of the center of the filter of this aspect. The temperature was measured by using a thermocouple.

Examples 15 through 26,

Comparative Examples 15 and 16

Used as the front transparent base plate 82A and used as the rear transparent base plate 82B were specified in Table 11. The transparent base plate 82A or 82B was formed with a transparent conductive film specified in Table 12, 13 on a surface thereof specified in Table 12, 13 (no transparent conductive film in Comparative Examples 15, 16). These plates 82A, 82B having a conductive mesh member specified in Table 12, 13 interposing between two adhesive films which were interposed between the plates 82A and 82B, were entered into a rubber bag which was then vacuumed to

TABLE 10

| Examples | | Transparent Conductive Film | | Conductive Mesh Member | | | Electromagnetic Shielding Efficiency (dB) | | | Light Transmittance (%) | Adiathermacy (Temperature Difference) |
|---|---|---|---|---|---|---|---|---|---|---|---|
| | | Material | Thickness (Å) | Metallic Fibers Material | Wire Diameter (mm) | Open Area Ratio (%) | 30 MHz | 100 MHz | 300 MHz | | |
| Example | 13 | ITO | 1000 | Stainless Steel | 0.14 | 82 | 62 | 55 | 40 | 74 | 30° C. |
| | 14 | silver | 50 | Stainless Steel | 0.14 | 82 | 62 | 59 | 50 | 66 | 40° C. |
| Comparative Example | 14 | None | | Stainless Steel | 0.14 | 82 | 43 | 35 | 23 | 80 | 10° C. |

It is apparent from Table 10 that good electromagnetic-wave shielding and light transmitting plates can be provided according to the sixth aspect.

In case of Comparative Example 14 having no heat ray reflecting conductive film, the surface temperature significantly rose because of radiation heat from the display. On the other hand, in case of Examples 13, 14 in which the heat ray reflecting conductive film was laminated, the rise in the surface temperature could be reduced in the same tests.

Hereinafter, the seventh aspect will be more concretely described by means of examples and comparative examples.

Adhesive films used in the examples and comparative examples were made in the same way as the first aspect.

be deaerated and pre-compressed by heating them at 90° C. for 10 minutes. After that, the object thus pre-compressed was entered into an oven and heated at 150° C. for 15 minutes so that it is crosslinked and hardened to be integrated.

The resultant plate was measured for its electromagnetic-wave shielding effect in a range between 30 MHz and 300 MHz, its light transmittance, and the presence or absence of a moiré phenomenon in the same manner as the first aspect. The results are tabulated in Tables 12, 13.

TABLE 11

| Examples | Transparent base plate 82A | Transparent base plate 82B |
|---|---|---|
| Example 15 | Glass plate of 1.1 mm thickness | Glass plate of 1.1 mm thickness |
| 16 | Glass plate of 1.1 mm thickness | Glass plate of 1.1 mm thickness |
| 17 | Glass plate of 1.1 mm thickness | Glass plate of 1.1 mm thickness |
| 18 | Glass plate of 1.1 mm thickness | Glass plate of 1.1 mm thickness |
| 19 | Glass plate of 1.1 mm thickness | Glass plate of 1.1 mm thickness |
| 20 | Glass plate of 1.1 mm thickness | Glass plate of 1.1 mm thickness |
| 21 | PET sheet of 0.1 mm thickness | Glass plate of 1.1 mm thickness |
| 22 | Glass plate of 1.1 mm thickness | PET sheet of 0.1 mm thickness |
| 23 | PET sheet of 0.1 mm thickness | Glass plate of 1.1 mm thickness |
| 24 | Glass plate of 1.1 mm thickness | PET sheet of 0.1 mm thickness |
| 25 | PET sheet of 0.1 mm thickness | Glass plate of 1.1 mm thickness |
| 26 | Glass plate of 1.1 mm thickness | PET sheet of 0.1 mm thickness |
| Comparative 15 | Glass plate of 1.1 mm thickness | Glass plate of 1.1 mm thickness |
| Example 16 | Glass plate of 1.1 mm thickness | Glass plate of 1.1 mm thickness |

TABLE 12

| | | Transparent Conductive Film | | Conductive Mesh Member | | | Electromagnetic | | | | |
|---|---|---|---|---|---|---|---|---|---|---|---|
| | | | Surface | Metallic Fiber | | Open | Shielding | | | Light | Presence or |
| | | | Electrical | | Wire | Area | Efficiency (dB) | | | Trans- | absence of |
| | | | Resistance | | Diameter | Ratio | 30 | 100 | 300 | mittance | moiré |
| Examples | Place | Material | (Ω/cm²) | Material | (mm) | (%) | MHz | MHz | MHz | (%) | phenomenon |
| Example 15 | Outer surface of transparent base plate 82A | ITO | 15 | Stainless Steel #17 | 0.14 | 82 | 61 | 58 | 47 | 68 | Absence |
| 16 | Inner surface of transparent base plate 82A | ITO | 15 | Stainless Steel #17 | 0.14 | 82 | 61 | 59 | 47 | 68 | Absence |
| 17 | Inner surface of transparent base plate 82B | ITO | 15 | Stainless Steel #17 | 0.14 | 82 | 60 | 59 | 47 | 68 | Absence |
| 18 | Inner surface of transparent base plate 82B | ITO | 15 | Stainless Steel #17 | 0.14 | 82 | 61 | 58 | 47 | 68 | Absence |
| 19 | Inner surface of transparent base plate 82A | ITO | 100 | Stainless Steel #17 | 0.14 | 82 | 58 | 45 | 36 | 76 | Absence |
| 20 | Inner surface of transparent base plate 82B | ITO | 100 | Stainless Steel #17 | 0.14 | 82 | 58 | 45 | 36 | 76 | Absence |
| 21 | Inner surface of transparent base plate 82A | ITO | 40 | Stainless Steel #17 | 0.14 | 82 | 62 | 55 | 40 | 74 | Absence |

TABLE 13

| | | Transparent Conductive Film | | Conductive Mesh Member | | | Electromagnetic | | | | |
|---|---|---|---|---|---|---|---|---|---|---|---|
| | | | Surface | Metallic Fiber | | Open | Shielding | | | Light | Presence or |
| | | | Electrical | | Wire | Area | Efficiency (dB) | | | Trans- | absence of |
| | | | Resistance | | Diameter | Ratio | 30 | 100 | 300 | mittance | moiré |
| Examples | Place | Material | (Ω/cm²) | Material | (mm) | (%) | MHz | MHz | MHz | (%) | phenomenon |
| Example 22 | Inner surface of transparent base plate 82B | ITO | 40 | Stainless Steel #17 | 0.14 | 82 | 62 | 55 | 40 | 74 | Absence |
| 23 | Inner surface of transparent base plate 82A | ITO | 200 | Stainless Steel #17 | 0.14 | 82 | 52 | 40 | 33 | 79 | Absence |
| 24 | Inner surface of transparent base plate 82B | ITO | 200 | Stainless Steel #17 | 0.14 | 82 | 52 | 40 | 33 | 79 | Absence |
| 25 | Inner surface of transparent base plate 82A | Ag | 2 | Stainless Steel #17 | 0.14 | 82 | 62 | 59 | 50 | 66 | Absence |
| 26 | Inner surface of transparent base plate 82B | Ag | 2 | Stainless Steel #17 | 0.14 | 82 | 62 | 59 | 50 | 66 | Absence |
| Comparative Example 15 | | None | | Stainless Steel #165 | 0.05 | 46 | 63 | 62 | 57 | 45 | Presence |
| 16 | | None | | Stainless Steel #17 | 0.14 | 82 | 43 | 33 | 23 | 80 | Absence |

It is apparent from Tables 12, 13 that good electromagnetic-wave shielding and light transmitting plates can be provided according to the seventh aspect.

In case of Comparative Examples 15, 16 having no transparent conductive film, the moiré phenomenon was produced between the mesh member and the matrix of the display. On the other hand, the combination of the open mesh and the transparent conductive film like this aspect prevents the moiré phenomenon, thereby making a filter having excellent electromagnetic-wave shielding efficiency and good light transparency.

Hereinafter, the eighth aspect will be more concretely described by means of examples and comparative examples.

Adhesive films used in the examples and comparative examples were made in the same way as the first aspect.

Examples 27 through 32,

Comparative Examples 17 and 18

Used as the front transparent base plate 92A was a glass plate having a thickness of 3.0 mm and used as the rear transparent base plate 92B was a PET sheet having a thickness of 0.1 mm. These plates 92A, 92B between which two adhesive films having a conductive mesh member shown in FIG. 14 therebetween were interposed were entered into a rubber bag which was then vacuumed to be deaerated and pre-compressed by heating them at 90° C. for 10 minutes. After that, the object thus pre-compressed was entered into an oven and heated at 150° C. for 15 minutes so that it is crosslinked and hardened to be integrated.

The resultant plate was measured for its electromagnetic-wave shielding effect in a range between 30 MHz and 300 MHz and its light transmittance in the same manner as the first aspect. The results are tabulated in Table 14.

TABLE 14

|  | Conductive Mesh Member | | | Electro- | Light |
|---|---|---|---|---|---|
|  | Metallic Fibers | | Open | magnetic | Trans- |
|  |  | Wire | Area | Shielding | mit- |
|  |  | Diameter | Ratio | Efficiency | tance |
| Examples | Material | (μm) | (%) | (300 MHz) | (%) |
| Example 27 | Stainless Steel | 10 | 97 | 34 | 95 |

TABLE 14-continued

|  | Conductive Mesh Member | | | Electro- | Light |
|---|---|---|---|---|---|
|  | Metallic Fibers | | Open | magnetic | Trans- |
|  |  | Wire | Area | Shielding | mit- |
|  |  | Diameter | Ratio | Efficiency | tance |
| Examples | | Material | (μm) | (%) | (300 MHz) | (%) |
| 28 | Stainless Steel | 10 | 87 | 53 | 85 |
| 29 | Stainless Steel | 10 | 78 | 57 | 75 |
| 30 | Stainless Steel | 50 | 85 | 38 | 82 |
| 31 | Stainless Steel | 50 | 46 | 57 | 42 |
| 32 | Stainless Steel | 100 | 37 | 40 | 35 |
| Comparative 17 | Stainless Steel | 0.5 | 100 | 3 | 96 |
| Example 18 | Stainless Steel | 500 | 4.5 | 60 | 2.5 |

Examples 33 through 38,

Comparative Examples 19 and 20

Electromagnetic-wave shielding and light transmitting plates were made in the same manner as Example 27 but using metal-coated organic fibers specified in Table 15 as the conductive mesh member The characteristics were measured in the same manner as the results are tabulated in Table 15.

TABLE 15

|  | Conductive Mesh Member | | | | Electro- | |
|---|---|---|---|---|---|---|
|  | Metal-coated Organic Fibers | | | Open | magnetic | Light |
|  | Material | Material of Organic | Wire Diameter | Area Ratio | Shielding Efficiency | Trans-mittance |
| Examples | of metal | Fibers | (μm) | (%) | (300 MHz) | (%) |
| Example 33 | silver | polyester | 10 | 97 | 38 | 95 |
| 34 | silver | polyester | 50 | 85 | 58 | 83 |
| 35 | silver | polyester | 100 | 37 | 42 | 34 |
| 36 | chrome | polyester | 10 | 97 | 32 | 95 |
| 37 | chrome | polyester | 50 | 85 | 54 | 83 |
| 38 | chrome | polyester | 100 | 37 | 38 | 34 |
| Comparative 19 | silver | polyester | 500 | 4.5 | 60 | 2 |
| Example 20 | chrome | polyester | 500 | 4.5 | 60 | 2.5 |

Examples 39 through 44

Electromagnetic-wave shielding and light transmitting plates were made in the same manner as Example 27 but using a conductive composite mesh member specified in Table 16 as the conductive mesh member The characteristics were measured in the same manner and the presence or absence of moiré phenomenon was tested in the same manner as the first aspect. The results are tabulated in Table 16.

TABLE 16

Conductive Composite Mesh Member

| Examples | Metallic Fibers | | Metal-coated Fibers | | | Organic Fibers | | Ratio of Metallic Fibers or Metal-coated Fibers to Organic Fibers | Open Area Ratio (%) |
|---|---|---|---|---|---|---|---|---|---|
| | Material | Wire Diameter (μm) | Material of coating Metal | Material of Organic Fibers | Wire Diameter (μm) | Material of Organic Fibers | Wire Diameter (μm) | Metallic Fibers or Metal-coated Fibers:Organic Fibers | |
| 39 | Stainless Steel | 20 | — | — | | polyester | 20 | 1:1 | 71 |
| 40 | Stainless Steel | 20 | — | — | | polyester | 20 | 1:2 | 85 |
| 41 | Stainless Steel | 20 | — | — | | polyester | 20 | 1:9 | 97 |
| 42 | — | — | Silver | Polyester | 20 | polyester | 20 | 1:1 | 71 |
| 43 | — | — | Silver | Polyester | 20 | polyester | 20 | 1:2 | 85 |
| 44 | — | — | Silver | Polyester | 20 | polyester | 20 | 1:9 | 97 |

| Examples | Electromagnetic Shielding Efficiency (300 MHz) | Light Transmittance (%) | Presence or absence of moiré phenomenon |
|---|---|---|---|
| 39 | 57 | 68 | Absence |
| 40 | 45 | 82 | Absence |
| 41 | 32 | 93 | Absence |
| 42 | 57 | 68 | Absence |
| 43 | 45 | 82 | Absence |
| 44 | 32 | 93 | Absence |

It is apparent from Tables 14 through 16 that good electromagnetic-wave shielding and light transmitting plates can be provided according to the eighth aspect.

What is claimed is:

1. An electromagnetic-wave shielding and light transmitting plate, comprising two transparent base plates and an adhesive layer made of resin in which conductive particles, each having a particle size of 0.5 mm or less, are dispersed, said base plates being integrally bonded by said adhesive layer, a ratio of the conductive particles relative to the resin in the adhesive layer being in a range from 0.1 to 50% by weight.

2. An electromagnetic-wave shielding and light transmitting plate as claimed in claim 1, wherein the resin is ethylene-vinyl acetate copolymer.

3. An electromagnetic-wave shielding and light transmitting plate as claimed in claim 1, further comprising a conductive mesh member interposed between said two transparent base plates.

4. An electromagnetic wave shielding and light transmitting plate as claimed in claim 1, wherein the conductive particles are made of carbon.

5. An electromagnetic-wave shielding and light transmitting plate comprising two transparent base plates and a conductive mesh member, interposed therebetween, which are integrally bonded by adhesive resin together, wherein one of the transparent base plates located at a side opposite to an electromagnetic wave source is formed with an antireflection film on a surface thereof, which is a laminated film of a high-refractive transparent film and a low-refractive transparent film, said high-refractive transparent film having a refractive index higher than that of the low-refractive transparent film.

6. An electromagnetic-wave shielding and light transmitting plate as claimed in claim 5, wherein that the high-refractive transparent film is a transparent conductive film.

7. An electromagnetic-wave shielding and light transmitting plate as claimed in claim 5, wherein the antireflection film is a multi-layered film formed by laminating alternately the high-refractive transparent films and low-refractive transparent films.

8. An electromagnetic-wave shielding and light transmitting plate as claimed in claim 5, characterized in that the adhesive resin is ethylene-vinyl acetate copolymer.

9. An electromagnetic-wave shielding and light transmitting plate as claimed in claim 5, wherein said high-refractive transparent film has the refractive index of at least 1.8, and the low-refractive transparent film has the refractive index of at most 1.6.

* * * * *